(12) United States Patent
Andre et al.

(10) Patent No.: US 9,277,661 B2
(45) Date of Patent: Mar. 1, 2016

(54) MAGNETIC LATCH

(71) Applicant: Apple Inc., Cupertino, CA (US)

(72) Inventors: Bartley K. Andre, Menlo Park, CA (US); Christiaan A. Ligtenberg, San Carlos, CA (US)

(73) Assignee: Apple Inc., Cupertino, CA (US)

( * ) Notice: Subject to any disclaimer, the term of this patent is extended or adjusted under 35 U.S.C. 154(b) by 7 days.

(21) Appl. No.: 14/185,875

(22) Filed: Feb. 20, 2014

(65) Prior Publication Data
US 2015/0237748 A1 Aug. 20, 2015

(51) Int. Cl.
*H05K 5/02* (2006.01)
*G06F 1/16* (2006.01)

(52) U.S. Cl.
CPC ............ *H05K 5/0221* (2013.01); *G06F 1/1616* (2013.01); *Y10T 29/49826* (2015.01); *Y10T 292/11* (2015.04)

(58) Field of Classification Search
None
See application file for complete search history.

(56) References Cited

U.S. PATENT DOCUMENTS

| | | | | |
|---|---|---|---|---|
| 6,366,440 | B1 * | 4/2002 | Kung ............................. | 361/147 |
| 6,891,722 | B2 * | 5/2005 | Chen et al. ................ | 361/679.55 |
| 8,009,424 | B2 * | 8/2011 | Zhu et al. .................. | 361/679.58 |
| 8,223,489 | B2 * | 7/2012 | Shih .......................... | 361/679.58 |
| 8,484,809 | B2 * | 7/2013 | Fiedler ............................ | 24/303 |
| 8,705,229 | B2 * | 4/2014 | Ashcraft et al. .......... | 361/679.27 |
| 8,755,180 | B2 * | 6/2014 | Yeh et al. ................. | 361/679.55 |
| 2002/0105401 | A1 | 8/2002 | Shih-Chung et al. | |
| 2007/0133156 | A1 * | 6/2007 | Ligtenberg et al. ........... | 361/681 |
| 2007/0138806 | A1 * | 6/2007 | Ligtenberg et al. ........ | 292/251.5 |
| 2008/0158800 | A1 | 7/2008 | Aoyagi | |
| 2008/0186683 | A1 * | 8/2008 | Ligtenberg et al. ........... | 361/726 |
| 2009/0015996 | A1 * | 1/2009 | Chang et al. ................... | 361/680 |
| 2010/0309627 | A1 * | 12/2010 | Noma et al. ............. | 361/679.58 |
| 2011/0026203 | A1 * | 2/2011 | Ligtenberg et al. ...... | 361/679.01 |
| 2013/0016460 | A1 | 1/2013 | Yeh et al. | |
| 2013/0107431 | A1 | 5/2013 | Xu | |
| 2014/0104782 | A1 * | 4/2014 | Lin et al. .................. | 361/679.44 |
| 2014/0160646 | A1 * | 6/2014 | Lu ............................ | 361/679.01 |
| 2014/0211409 | A1 * | 7/2014 | Wolff et al. .............. | 361/679.43 |
| 2014/0293525 | A1 * | 10/2014 | Tomita et al. ............ | 361/679.06 |
| 2014/0313665 | A1 * | 10/2014 | Delpier et al. ........... | 361/679.55 |

OTHER PUBLICATIONS

PCT Application No. PCT/US2015/018094—International Search Report and Written Opinion dated May 29, 2015.

* cited by examiner

*Primary Examiner* — Hoa C Nguyen
*Assistant Examiner* — Xanthia C Cunningham
(74) *Attorney, Agent, or Firm* — Downey Brand LLP

(57) ABSTRACT

Magnetic latch mechanisms are provided. The latch mechanisms may be employed to releasably hold a portable computing device in a closed configuration. The latch mechanism may include first and second magnetic members that may be respectively coupled to the base and lid of the portable computing device. One of the magnetic members may be moveable. Accordingly, when the moveable magnetic member is moved, the position of the magnetic members relative to one another changes, which alters a magnetic interaction therebetween. For example, attractive portions of the magnetic members may be moved away from one another. Additionally, repulsive portions of the magnetic members may be moved into proximity. Thus, opening of the lid of the portable computing device may be facilitated.

17 Claims, 22 Drawing Sheets

MAGNETIC LATCH

FIELD

The present disclosure relates generally to latches, and more particularly to magnetic latches which may be employed to releasably secure portable computing devices in a closed configuration.

BACKGROUND

Devices such as portable computing devices may include two housing portions. For example, the housing portions may comprise a lid and a base. In this regard, by way of further example, a laptop computer may include a base with a keyboard and a lid with a display.

The lid may be configured to pivot with respect to the base. In an open configuration, both the display and the keyboard may be exposed such that a user may interact with the keyboard and the display during use of the laptop. Further, in a closed configuration, the display and the keyboard may be protected. In this regard, the keyboard and the display may fold toward one another, such that only outer protective portions of the housing are exposed. Further, the laptop may define a relatively thin profile in the closed configuration, which may facilitate transport thereof.

A latch may be employed to releasably retain the laptop in the closed configuration. Use of a latch may provide additional protection for the laptop. In this regard, accidental opening of the laptop may be substantially averted.

In some embodiments the latch may comprise a mechanical mechanism employing interference fit or other mechanical interaction to releasably retain the laptop in a closed configuration. However, mechanical mechanisms may be prone to failure during drop events or may experience wear over time which may detrimentally affect functionality of the latch. Alternatively the latch may comprise a magnetic mechanism. However, magnetic mechanisms may provide an unsatisfactory user experience in terms of the release forces involved. Accordingly, improved latch mechanism configured to address these and other problems may be desirable.

SUMMARY

The present application relates to latch mechanisms which may be employed to releasably hold a portable computing device such as a laptop computer or other device in a closed configuration. Such portable computing devices may include a lid and a base. A hinge may couple the lid and the base such that the portable computing device is moveable between open and closed configurations.

The latch mechanism may be coupled to the portable computing device opposite from the hinge. The latch mechanism may be a magnetic latch mechanism. In this regard, the latch mechanism may include first and second magnetic members.

The first magnetic member may be coupled to the lid and the second magnetic member may be coupled to the base. The second magnetic member may be moveable such that magnetic interaction with the first magnetic member is altered. For example, the base may comprise a moveable portion and a remainder portion, wherein the second magnetic member is coupled to the moveable portion of the base. Accordingly, when the moveable portion of the base is moved, the second magnetic member may be shifted relative to the first magnetic member.

This movement may release an attractive force between the magnetic members due to the attracted portions thereof moving away from one another. In some embodiments movement of the second magnetic member may additionally cause the magnetic members to repulse one another. In this regard, portions of the magnetic members defining similar polarities may be brought into proximity, such that the lid is pushed away from the base. Accordingly, opening of the lid may be facilitated.

Other apparatuses, methods, features and advantages of the disclosure will be or will become apparent to one with skill in the art upon examination of the following figures and detailed description. It is intended that all such additional systems, methods, features and advantages be included within this description, be within the scope of the disclosure, and be protected by the accompanying claims.

BRIEF DESCRIPTION OF THE DRAWINGS

The included drawings are for illustrative purposes and serve only to provide examples of possible structures and arrangements for the disclosed apparatuses, assemblies, methods, and systems. These drawings in no way limit any changes in form and detail that may be made to the disclosure by one skilled in the art without departing from the spirit and scope of the disclosure.

DETAILED DESCRIPTION

Figure 1:
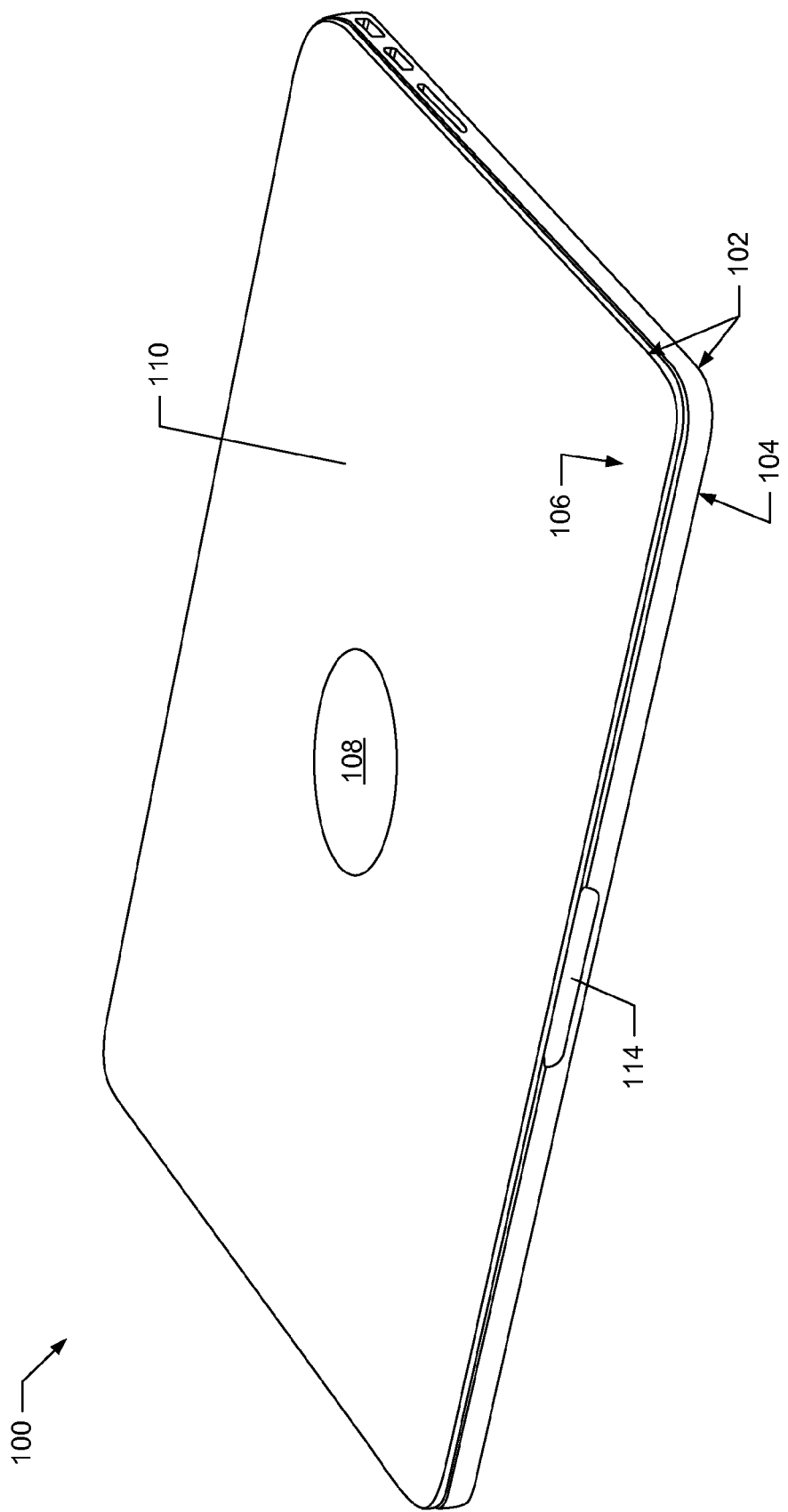
FIG. 1 illustrates a front perspective view of an embodiment of the portable computing device in a closed configuration according to an example embodiment of the present disclosure.

Representative applications of systems, apparatuses, computer program products and methods according to the presently described embodiments are provided in this section. These examples are being provided solely to add context and aid in the understanding of the described embodiments. It will thus be apparent to one skilled in the art that the presently described embodiments can be practiced without some or all of these specific details. In other instances, well known process steps have not been described in detail in order to avoid unnecessarily obscuring the presently described embodiments. Other applications are possible, such that the following examples should not be taken as limiting.

As described in detail below, the following relates to magnetic latches. Embodiments of the disclosure may be employed in housings for a variety of devices including, for example, electronic devices. By way of more specific example, the magnetic latches may be employed in laptop computers. However it should be understood that various other embodiments of devices may include the magnetic latches in accordance with embodiments of the present disclosure.

In one embodiment a portable computing device can include a multi-part housing having a top case and a bottom case joining at a reveal to form a base. The portable computing device can have an upper portion (or lid) that can house a display screen and other related components whereas the base can house various processors, drives, ports, battery, keyboard, touchpad and the like. The top case and the bottom case can each be joined in a particular manner at an interface region such that the gap and offset between top and bottom cases are not only reduced, but are also more consistent from device to device during the mass production of devices.

In a particular embodiment, the lid and base can be pivotally connected with each other by way of what can be referred to as a clutch assembly. The clutch assembly can include at least a cylindrical portion that in turn includes an annular outer region, and a central bore region surrounded by the annular outer region, the central bore suitably arranged to provide support for electrical conductors between the base and electrical components in the lid. The clutch assembly can also include a plurality of fastening regions that couple the clutch to the base and the lid of the portable computing device with at least one of the fastening regions being integrally formed with the cylindrical portion such that space, size and part count are minimized.

The top case can include a cavity, or lumen, into which a plurality of operational components can be inserted during an assembly operation. In the described embodiment, the operational components can be inserted into the lumen and attached to the top case in a "top-bottom" assembly operation in which top most components are inserted first followed by components in a top down arrangement. For example, the top case can be provided and shaped to accommodate a keyboard module. The keyboard module can include a keyboard assembly formed of a plurality of keycap assemblies and associated circuitry, such as a flexible membrane on which can be incorporated a switching matrix and protective feature plate. Therefore, following the top-bottom assembly approach, the keyboard assembly is first inserted into the top case followed by the flexible membrane and then the feature plate that is attached to the top case. Other internal components can then be inserted in a top to bottom manner (when viewed from the perspective of the finished product).

In one embodiment, the keyboard module can be configured in such a way that a keycap assembly can be used to replace a power switch. For example, in a conventional keyboard each of a top row of keycaps can be assigned at least one function. However, by re-deploying one of the keycaps as a power button, the number of operational components can be reduced by at least eliminating the switch mechanism associated with the conventional power button and replacing it with the already available keycap assembly and associated circuitry.

In addition to the keyboard, the portable computing device can include a touch sensitive device along the lines of a touch pad, touch screen, etc. In those embodiments where the portable computing device includes a touch pad the touch pad can be formed from a glass material. The glass material provides a cosmetic surface and is the primary source of structural rigidity for the touchpad. The use of the glass material in this way significantly reduces the overall thickness of the touchpad compared to previous designs. The touchpad can include circuitry for processing signals from a sensor associated with the touchpad. In one embodiment, the circuitry can be embodied as a printed circuit board (PCB). The PCB can be formed of material and placed in such a way that it provides structural support for the touchpad. Thus, a separate touchpad support is eliminated.

In one embodiment, the top case can be formed from a single billet of aluminum that is machined into a desired shape and size. The top case can include an integrated support system that adds to the structural integrity of the top case. The integrated support system can be continuous in nature in that there are no gaps or breaks. The integrated support system can be used to provide support for individual components (such as a keyboard). For example, the integrated support system can take the form of ribs that can be used as a reference datum for a keyboard. The ribs can also provide additional structural support due to the added thickness of the ribs. The ribs can also be used as part of a shield that helps to prevent light leaking from the keyboard as well as act as a Faraday cage that prevents leakage of extraneous electromagnetic radiation.

The continuous nature of the integrated support system can result in a more even distribution of an external load applied to the multi-part housing resulting in a reduced likelihood of warping, or bowing that reduces risk to internal components. The integrated support system can also provide mounting structures for those internal components mounted to the multi-part housing. Such internal components include a mass storage device (that can take the form of a hard disk drive, HDD, or solid state drive, SSD), audio components (audio jack, microphone, speakers, etc.) as well as input/output devices such as a keyboard and touch pad.

These and other embodiments are discussed below with reference to FIGS. 1-4. However, those skilled in the art will readily appreciate that the detailed description given herein with respect to these figures is for explanatory purposes only.

FIG. 1 illustrates a portable computing device 100 in the form of a laptop computer in accordance with an example embodiment of the present disclosure. More particularly, FIG. 1 shows a front facing perspective view of the portable computing device 100 in a closed configuration. As illustrated, the portable computing device 100 may include a housing 102 comprising a base 104 and a lid 106, which may also be referred to as a first housing portion and a second housing portion. In the closed configuration, the lid 106 and the base 104 form what appears to be a uniform structure having a continuously varying and coherent shape that enhances both the look and feel of the portable computing device 100. In some embodiments the portable computing device 100 may include a logo 108 at a rear case 110 of the lid 106 of the housing 102. In one embodiment, the logo 108 can be illuminated by light emitted from a display 112 (see, e.g., FIG. 2).

The base 104 can be pivotally connected to the lid 106 by way of a hinge that may include a clutch assembly in some embodiments. The base 104 may include an inset portion 114 suitable for assisting a user in lifting the lid 106 by, for example, a finger. Accordingly, the lid 106 of the housing 102 can be moved with respect to the base 104 of the housing with the aid of the clutch assembly from a closed configuration (see, e.g., FIG. 1) to an open configuration (see, e.g., FIG. 2).

Figure 2:
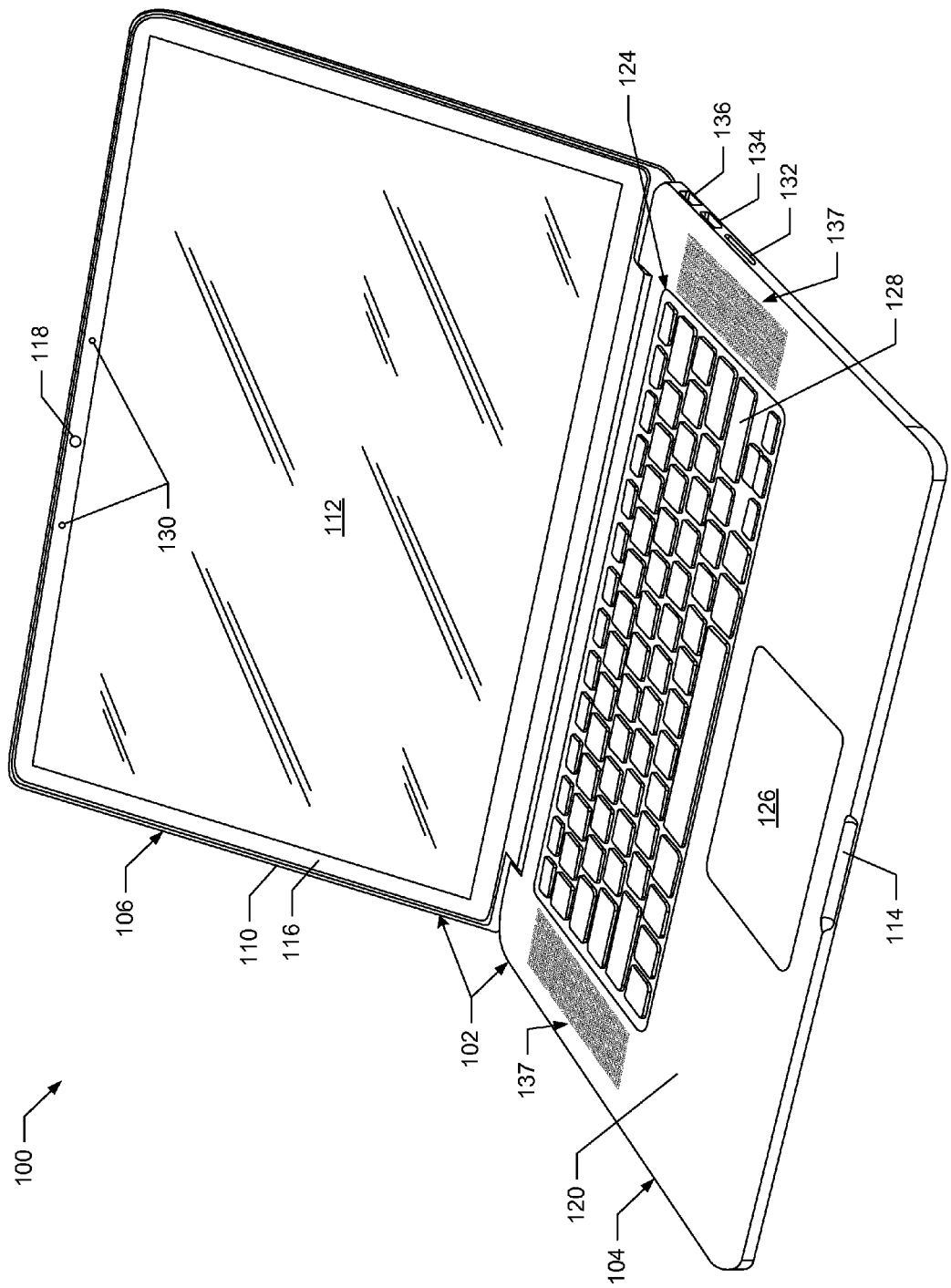
FIG. 2 illustrates the portable computing device of FIG. 1 in an open configuration according to an example embodiment of the present disclosure.

FIG. 2 shows a front facing perspective view of the portable computing device 100 in the open configuration. The display 112 may be coupled to the rear case 110 of the lid 106 such that the display is provided with structural support. In this regard, the lid 106 can be formed to have uni-body construction provided by the rear case 110 that can provide additional strength and resiliency to the lid which is particularly important due to the stresses caused by repeated opening and closing. In addition to the increase in strength and resiliency, the uni-body construction of the lid 106 can reduce overall part count by eliminating separate support features, which may decrease manufacturing cost and/or complexity.

The lid 106 may include a mask (also referred to as display trim) 116 that surrounds the display 112. The display trim 116 can be formed of an opaque material such as ink deposited on top of or within a protective layer of the display 112. Thus, the display trim 116 can enhance the overall appearance of display 112 by hiding operational and structural components as well as focusing attention onto the active area of the display.

The display 112 can display visual content such as a graphical user interface, still images such as photos as well as video media items such as movies. The display 112 can display images using any appropriate technology such as a liquid crystal display (LCD), a light emitting diode (LED) display, an organic light emitting diode (OLED) display, etc. Further, the portable computing device 100 may include an image capture device 118. In one embodiment the image capturing device 118 may be located on a transparent portion of the display trim 116. The image capture device 118 can be configured to capture both still and video images in some embodiments.

Figure 3:
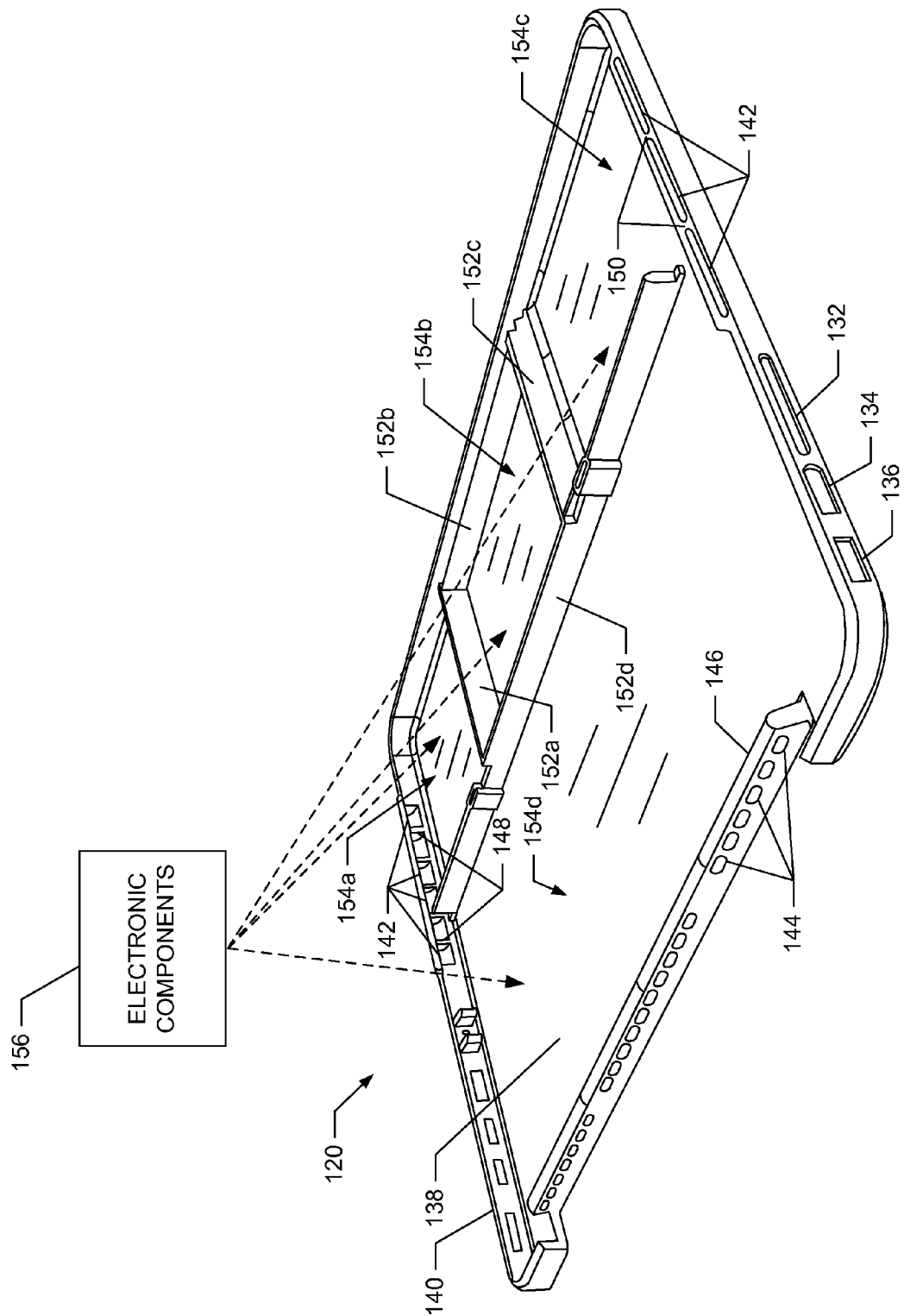
FIG. 3 illustrates a bottom perspective view of a top case of a base of the portable computing device of FIG. 1 according to an example embodiment of the present disclosure.
Figure 4:
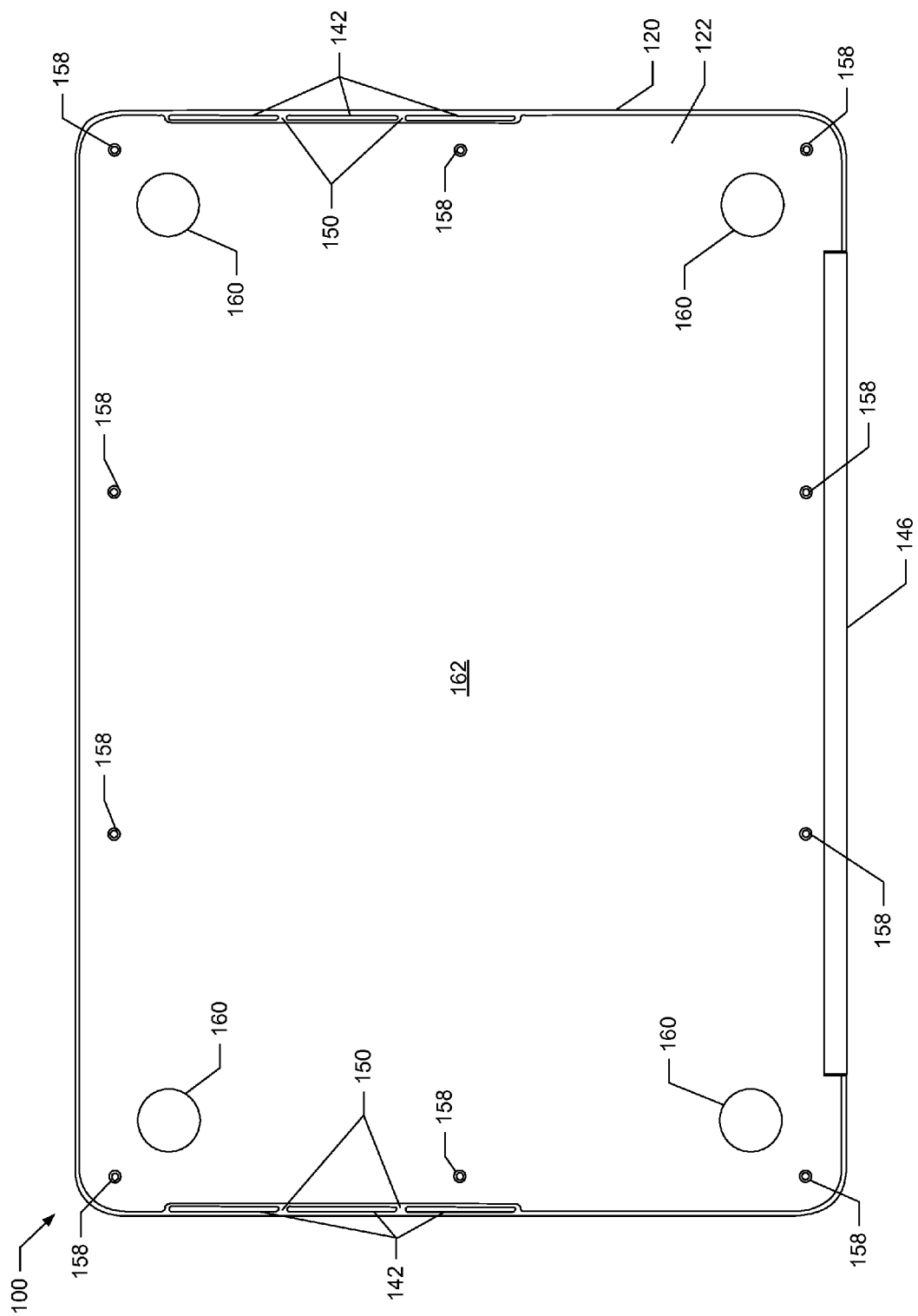
FIG. 4 illustrates a bottom view of the portable computing device of FIG. 1 according to an example embodiment of the present disclosure.

The base 104 may comprise a top case 120 (see, e.g., FIG. 3) fastened to a bottom case 122 (see, e.g., FIG. 4). As illustrated in FIG. 2, the top case 120 can be configured to accommodate various user input devices such as a keyboard 124 and a touchpad 126. The keyboard 124 can include a plurality of low profile keycap assemblies 128. In one embodiment, an audio transducer (not shown) can use selected portions of keyboard 124 to control output audio signals such as music. One or more microphones 130 can be located on the lid 106. The microphones 130 may be spaced apart to improve frequency response of an associated audio circuit.

Each of the plurality of keycap assemblies 128 can have a symbol imprinted thereon for identifying the key input associated with the particular key pad. The keyboard 124 can be arranged to receive a discrete input at each keycap assembly 128 using a finger motion referred to as a keystroke. In the described embodiment, the symbols on each keycap assembly 128 can be laser etched thereby creating an extremely clean and durable imprint that will not fade under the constant application of keystrokes over the life of portable computing device 100. In order to reduce component count, one of the keycap assemblies 128 can be re-provisioned as a power button. In this way, the overall number of components in the portable computing device 100 can be commensurably reduced.

The touchpad 126 can be configured to receive finger gesturing. A finger gesture can include touch events from more than one finger applied in unison. The gesture can also include a single finger touch event such as a swipe or a tap. The gesture can be sensed by a sensing circuit in the touchpad 126 and converted to electrical signals that are passed to a processing unit for evaluation. In this way, the portable computing device 100 can be at least partially controlled by touch.

One or more data ports 132, 134, 136 can be used to transfer data and/or power between an external circuit(s) and the portable computing device 100. The data ports can include, for example, an input slot 132 that can be used to accept a memory card (such as a FLASH memory card), whereas the remaining data ports 134, 136 can be used to accommodate data connections such as USB, FireWire, Thunderbolt, and so on. Further, in some embodiments, one or more speaker grids 137 can be used to output audio from an associated audio component enclosed within base 104 of the housing 102.

FIG. 3 illustrates a perspective bottom view of the top case 120 of the base 104 of the housing 102. As illustrated, the top case 120 may comprise a major wall 138 and an outer rim 140 extending therefrom. A plurality of vents 142 may be defined in the top case 120. For example, the vents 142 are defined in the outer rim 140 in the illustrated embodiment. The vents 142 may be configured to provide a flow of outside air that can be used to cool internal components by allowing air to enter or exit therethrough. For example, the vents 142 in the outer rim 140 may comprise intake vents and a plurality of vents 144 defined in a rear wall 146 may comprise exhaust vents. In another embodiment the vents 142 in the outer rim 140 can act as a secondary air intake subordinate to primary air intake vents or the vents in the outer rim may comprise exhaust vents.

The vents 142 in the outer rim 140 can also be used to output audio signals in the form of sound generated by an audio module. Accordingly, the vents 142 can be used to output sound at a selected frequency range in order to improve quality of an audio presentation by the portable computing device 100. Additionally, the vents 142 in the outer rim 140 can be part of an integrated support system for the top case 120. In this regard, internal ribs 148 may be positioned within the vents 142 and/or external ribs 150 may be positioned between the vents to provide additional structural support to the portable computing device 100. In some embodiments the vents 142 may be machined from the material defining the top case 120 with the ribs 148, 150 comprising retained material.

The cadence and size of the vents 142 can be used to control air flow into portable computing device 100 as well as control emission of radio frequency (RF) energy in the form of electromagnetic interference (EMI) from the portable computing device. In this regard, the internal ribs 148 can separate an area within the vents 142 to produce an aperture sized to reduce passage of RF energy. The size of an aperture defined by each of the vents 142 may dictate the wavelength of RF energy that can be "trapped" by the aperture. In this case, the size of vents 142 is such that a substantial portion of RF energy emitted by internal components can be trapped within the portable computing device 100. Furthermore, by placing vents 142 at a downward facing outer surface of the top case 120, the aesthetics of portable computing device 100 can be enhanced since views of internal components from an external observer are eliminated during normal use.

As illustrated, the rear wall 146 may extend from the major wall 138. The rear wall 146 may be configured to hide the clutch at the hinge between the base 104 and the lid 106 of the housing 102. A plurality of inner sidewalls 152a-d may also extend from the major wall 138. The inner sidewalls 152a-d may divide an interior space defined by the base 104 into a plurality of compartments 154a-d.

As schematically illustrated in FIG. 3, the portable computing device 100 may include a plurality of electronic components 156, which may be received in one or more of the compartments 154a-d. As may be understood, by way of example, the electronic components 156 may include a mass storage device (e.g., a hard drive or a solid state storage device such as a flash memory device including non-transitory and tangible memory that may be, for example, volatile and/or non-volatile memory) configured to store information, data, files, applications, instructions or the like, a processor (e.g., a microprocessor or controller) configured to control the overall operation of the portable electronic device, a communication interface configured for transmitting and receiving data through, for example, a wired or wireless network such as a local area network (LAN), a metropolitan area network (MAN), and/or a wide area network (WAN), for example, the Internet, a fan, a heat pipe, and one or more batteries. However, various other electronic components may additionally or alternatively be received in the housing 102 of the portable electronic device as may be understood by one having skill in the art.

FIG. 4 shows an external view of the bottom of the bottom case 122 of the base 104 of the housing 102. One or more fasteners 158 may be positioned at the bottom case 122 of the base 104 of the housing 102. The fasteners 158 may be configured to secure the bottom case 122 to the top case 120 to enclose the above-described electronic components 156.

Additionally, in some embodiments the portable computing device 100 may include one or more bumpers. Bumpers may serve a variety of purposes. In this regard, in the illustrated embodiment the portable computing device 100 includes bumpers in the form of feet 160 coupled to an outer surface 162 of the bottom case 122 of the base 104 of the housing 102.

However, it may be desirable to provide portable computing devices and other devices employing a housing with a latch. In this regard, embodiments of a magnetic latch mechanism are described hereinafter. Note that while the latch mechanism is generally described as being employed to releasably couple a lid to a base of a portable computing device, the latch mechanism may be engaged with, and configured to releasably couple a first housing portion and a second housing portion of substantially any device. Accordingly, the description related to usage of the latch mechanism with a portable computing device is provided for example purposes only.

Figure 5:
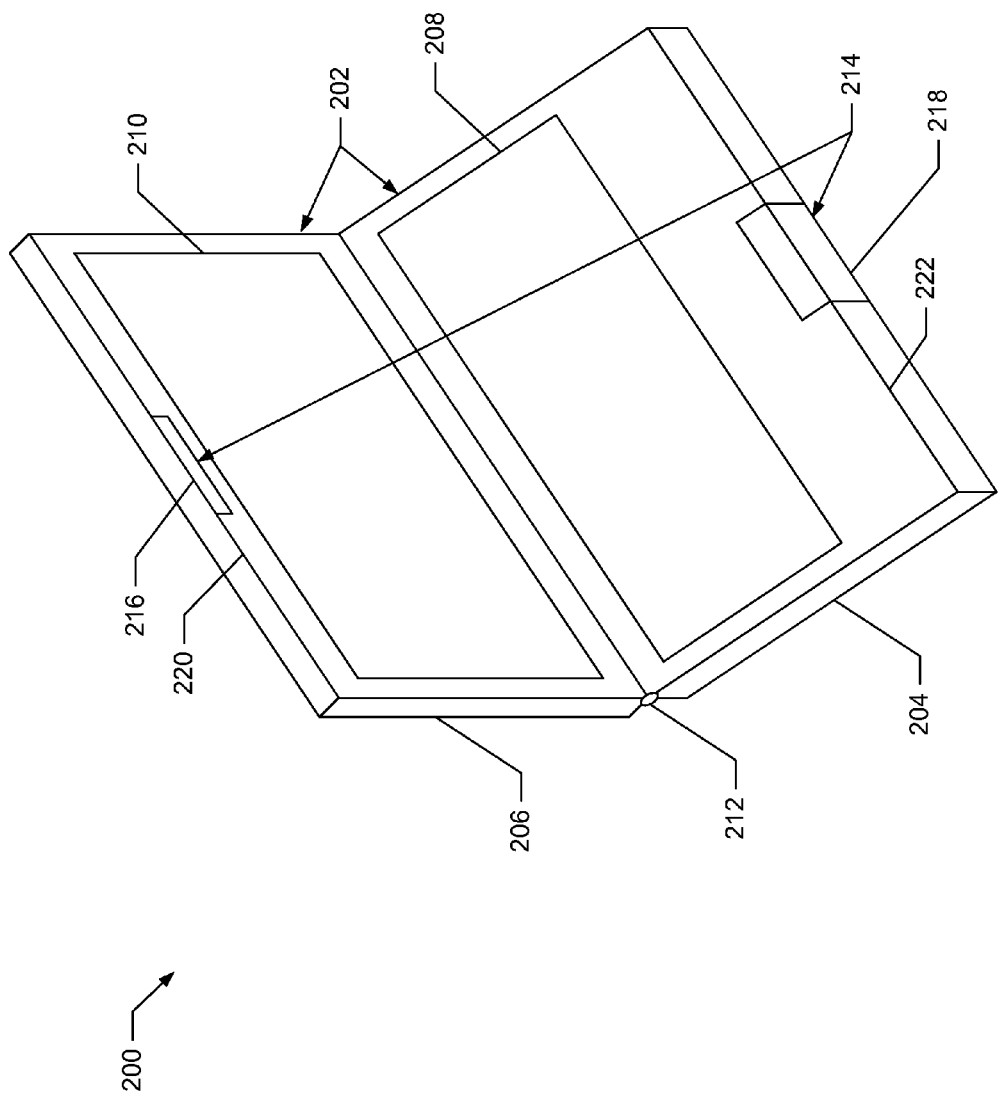
FIG. 5 illustrates a front perspective view of an embodiment of a portable computing device including a latch mechanism in an open configuration according to an embodiment of the present disclosure.

However, by way of example, FIG. 5 illustrates an example embodiment of a portable computing device 200. The portable computing device 200 may include some or all of the features of the portable computing device 100 described above. Briefly, however, the portable computing device may include a housing 202 comprising a base 204 and a lid 206. The base 204 may include a keyboard 208. Further, the lid 206 may include a display 210.

The lid 206 and the base 204 may be coupled to one another at a hinge 212. The hinge 212 may be configured to allow for pivoting of the lid 206 relative to the base 204 between an open configuration (see, FIG. 5) and a closed configuration (see, FIG. 6). The hinge 212 may comprise a clutch assembly in some embodiments, which may be configured to affect the force required to move the lid 206 relative to the base 204 between the open and closed configurations.

Figure 6:
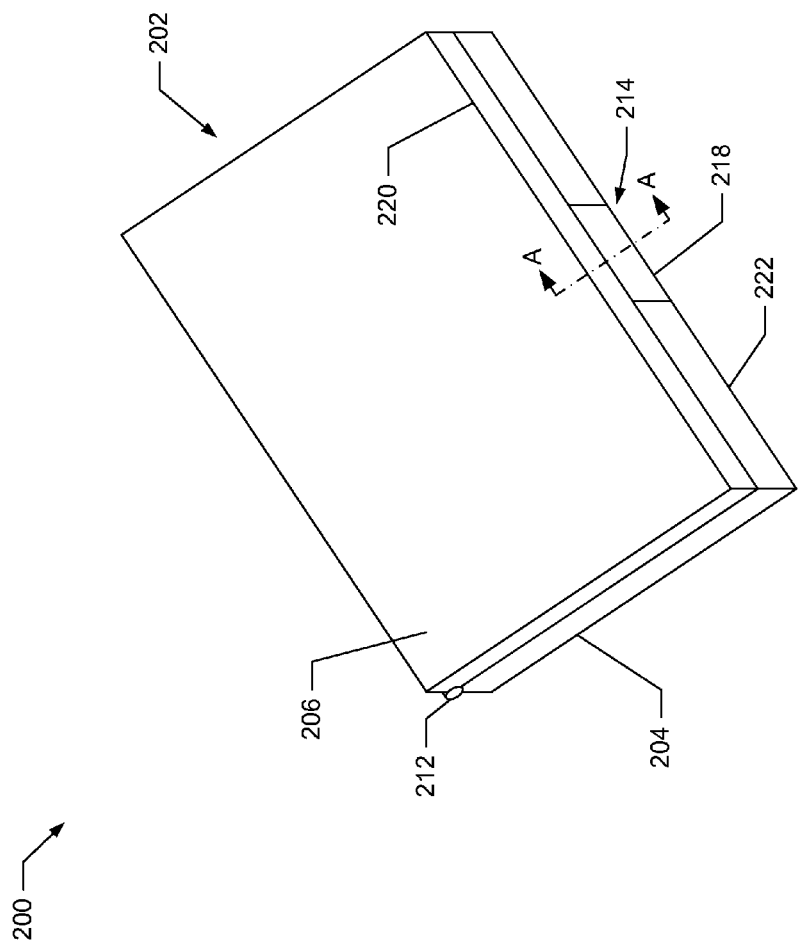
FIG. 6 illustrates a front perspective view of the portable computing device of FIG. 5 in a closed configuration.

As further illustrated in FIGS. 5 and 6, the portable computing device may additionally include a latch mechanism 214. The latch mechanism 214 may comprise a first magnetic member 216 configured to engage and engaged with the lid 206 and a second magnetic member 218 configured to engage and engaged with the base 204. In some embodiments the first magnetic member 216 may be positioned proximate an edge 220 of the lid 206. Similarly, the second magnetic member 218 may be positioned proximate an edge 222 of the base 204. More particularly, the first magnetic member 216 and the second magnetic member 218 may be respectively positioned proximate edges 220, 222 of the lid 206 and the base 204 opposite from the hinge 212. In this regard, the latch mechanism 214 may be positioned opposite from the hinge 212 such that the moment arm associated with the latch mechanism is relatively large. Accordingly, the latch mechanism 214 may prevent accidental opening of the portable computing device 200.

Various embodiments of the latch mechanism 214 are described hereinafter. In each of the embodiments, one of the magnetic members 216, 218 is configured to move. In the embodiments described hereinafter, the second magnetic member 218 is configured to move. However, it should be understood that the first magnetic member 216 may additionally or alternatively be configured to move. Further movement of the magnetic members may be relative to one or both of the edges 220, 222 of the housing 202, or portions thereof, opposite from the hinge 212. As described below, such movement may alter a magnetic interaction between the first magnetic member 216 and the second magnetic member 218. By altering the magnetic interaction between the first magnetic member 216 and the second magnetic member 218, simplified release of the latch mechanism and/or other benefits described below may be provided.

Figure 7:
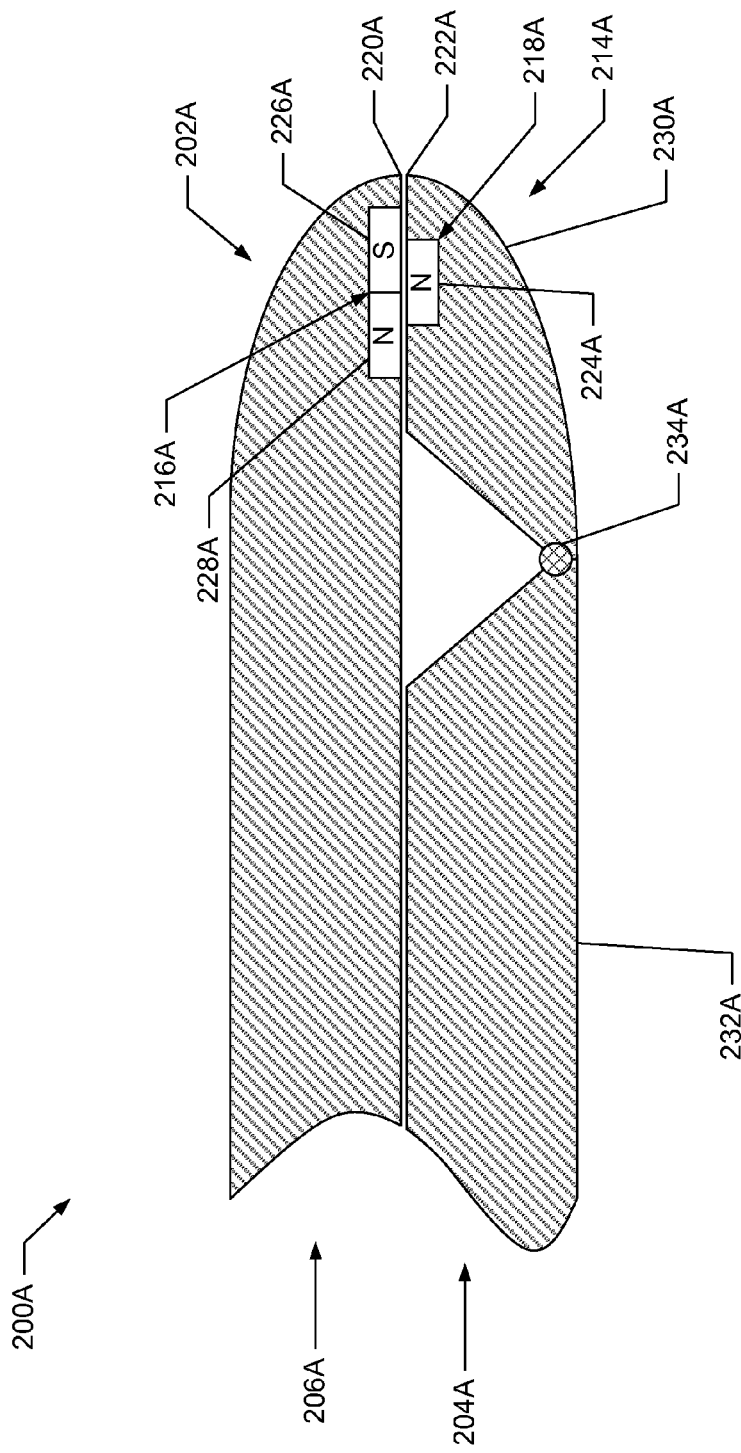
FIG. 7 illustrates a sectional view through the portable computing device of FIG. 6 along line A-A in an embodiment in which a moveable portion of the latch mechanism is configured to pivot, the latch mechanism illustrated in an engaged configuration according to an example embodiment of the present disclosure.
Figure 8:
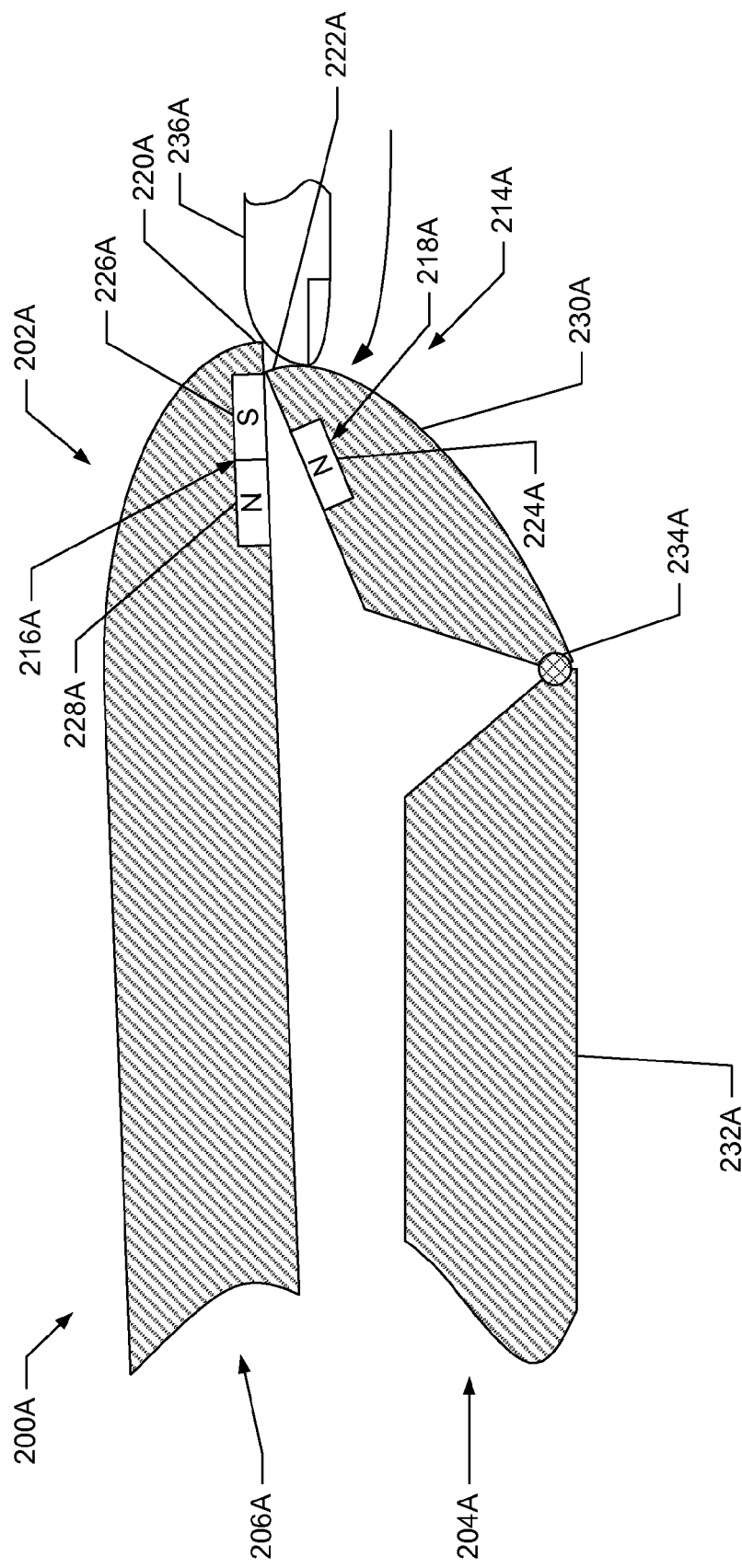
FIG. 8 illustrates the portable computing device of FIG. 7 in a released configuration in which portions of the latch mechanism repulse one another.

FIGS. 7-12 illustrate cross-sectional views through embodiments of the portable computing device 200 along line A-A from FIG. 6. In this regard, FIGS. 7 and 8 illustrate a first embodiment of the portable computing device 200A. In the latch mechanism 214A illustrated in FIGS. 7 and 8, the second magnetic member 218A comprises a magnet 224A. In some embodiments the magnet 224A and/or the other magnets disclosed herein may comprise a permanent magnet, which may be formed from a material such as neodymium. In this regard, neodymium may produce a relatively strong magnetic field. Further, in some embodiments the magnets disclosed herein may comprise electromagnets which are connected to a power supply. A controller may provide current from the power supply to the magnet so as to produce magnetic attraction and/or repulsion as described hereinafter.

Further, the first magnetic member 216A comprises a first magnet 226A and a second magnet 228A, wherein the first magnet 226A is positioned closer to the edge 220A of the lid 206A than the second magnet 228A. Thus, the first magnet 226A and the second magnet 228A may be positioned at differing distances from the edge 220A of the lid 206A. The first magnet 226A and the second magnet 228A of the first magnetic member 216A define opposing polarities. Further, the magnet 224A of the second magnetic member 218A and the first magnet 226A of the first magnetic member 216A define opposing polarities.

Accordingly, in the closed configuration illustrated in FIG. 7, the first magnet 226A of the first magnetic member 216A and the magnet 224A of the second magnetic member 218A are attracted to one another due to their opposing polarities. Thus, the latch mechanism 214A holds the base 204A and the lid 206A in the closed configuration. Thereby, accidental opening of the portable computing device 200A may be averted.

The latch mechanism 214A may be configured to release to allow pivoting of the lid 206A with respect to the base 204A. In this regard, in one embodiment the magnetic members may be relatively weak so as to facilitate release thereof. However, use of relatively weak magnetic members may also lead to inadvertent opening of the housing. Accordingly, relatively strong magnetic members may be employed. However, use of relatively strong magnetic members may make moving the lid from the closed configuration to the open configuration difficult. Accordingly, embodiments of the present disclosure may include features configured to facilitate moving the lid relative to the base from the closed configuration to the open configuration.

In this regard, as illustrated in FIG. 8, the second magnetic member 218A may be configured to pivot with respect to the lid 206A. More particularly, in the embodiment illustrated in FIGS. 7 and 8, the base 204A comprises a moveable portion 230A configured to move with respect to a remainder 232A of the base. For example, the moveable portion 230A and the remainder 232A of the base 204A may be connected by a hinge 234A. The second magnetic member 218A may be engaged with the moveable portion 230A of the base 204A.

Accordingly, when a user pushes up on the moveable portion 230A of the base 204A (e.g., with a finger 236A), the moveable portion may pivot with respect to the remainder 232A of the base 204A. As the moveable portion 230A pivots, the moveable portion and/or the user's finger 236A may lift the lid 206A. Further, pivoting of the moveable portion 230A may cause the magnet 224A of the second magnetic member 218A to retract from the first magnet 226A of the first magnetic member 216A, which may reduce the magnetic attraction therebetween. Further, the pivoting movement of the moveable portion 230A may cause the magnet 224A of the second magnetic member 218A to angle toward the second magnet 228A of the first magnetic member 216A. Due to the magnet 224A of the second magnetic member 218A and the second magnet 228A of the first magnetic member 216A defining the same or similar polarities, the latch mechanism 214A may switch from holding the lid 206A to the base 204A to forcing the lid away from the base. Accordingly, the latch mechanism 214A may facilitate release of the lid 206A from the base 204A when a user presses on the moveable portion 230A of the base 204A.

Further, as illustrated in FIG. 7, the edge 222A of the base 204A may substantially align with the edge 220A of the lid 206A prior to movement of the second magnetic member 218A. In this regard, alignment of the edges 220A, 222A of the housing 202A may provide a pleasing appearance. However, the edge 222A of the base 204A may be configured to retract from the edge 220A of the lid 206A during movement of the second magnetic member 218A such that the edge of the lid is exposed, as illustrated in FIG. 8. By exposing the edge 220A of the lid 206A, a user may more easily open the lid. Further, by allowing for movement of the moveable portion 230A in the manner described above, the edge 220A of the lid may be exposed without requiring use of an inset portion (see, e.g., inset portion 114 in FIG. 1). In this regard, use of an inset portion may adversely affect the appearance of the portable computing device and/or require additional machining.

Figure 9:
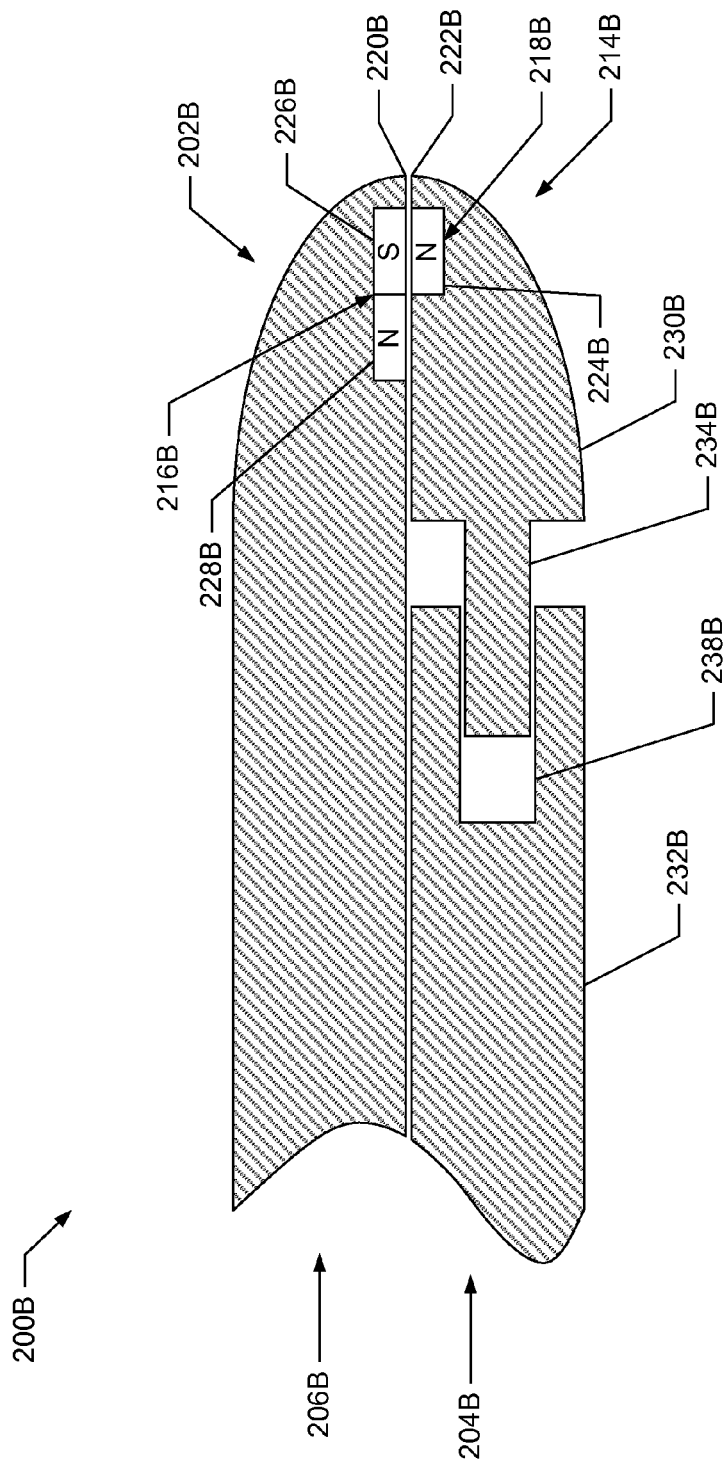
FIG. 9 illustrates a sectional view through the portable computing device of FIG. 6 along line A-A in an embodiment in which a moveable portion of the latch mechanism is configured to translate, the latch mechanism illustrated in an engaged configuration according to an example embodiment of the present disclosure.
Figure 10:
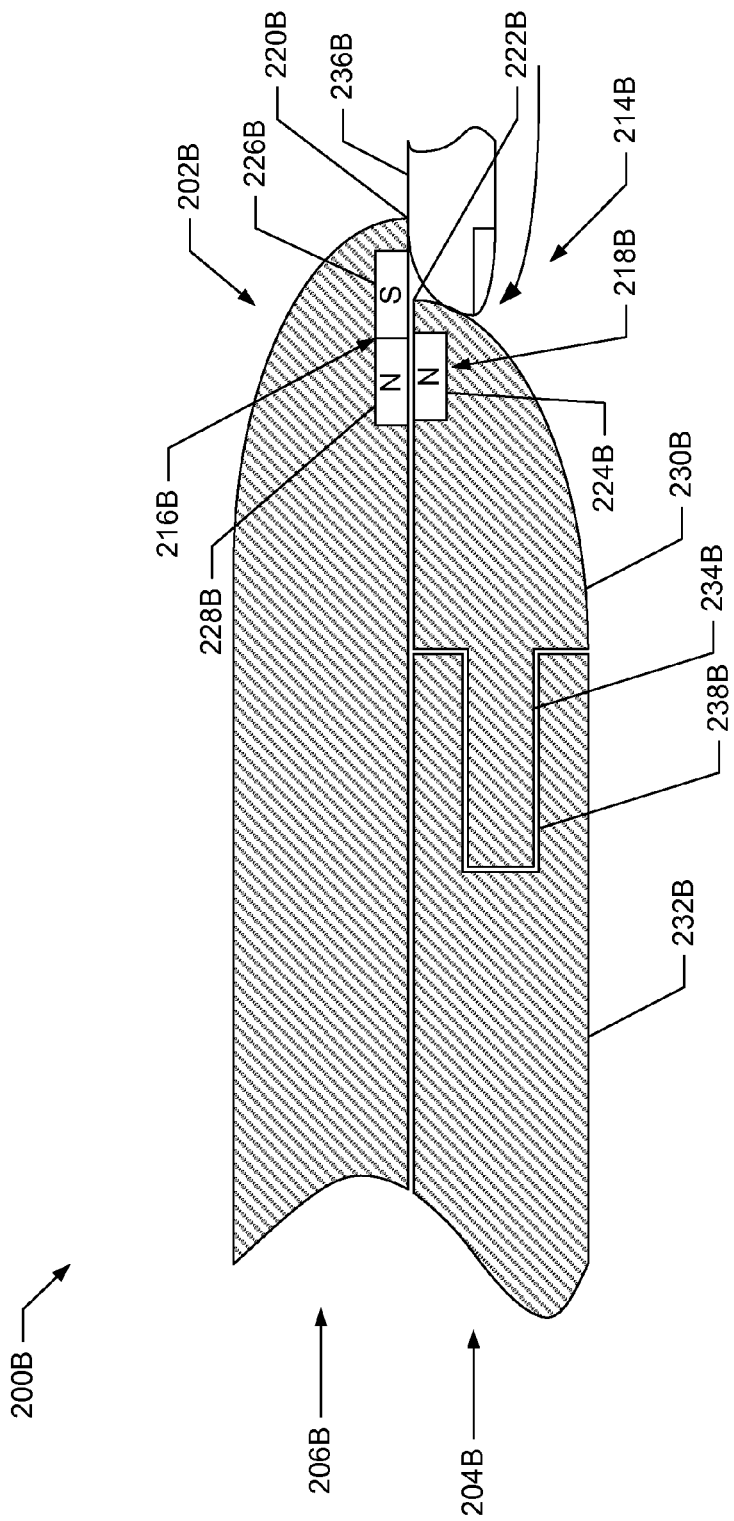
FIG. 10 illustrates the portable computing device of FIG. 9 in a released configuration in which portions of the latch mechanism repulse one another.

FIGS. 9 and 10 illustrate a second embodiment of the portable computing device 200B. In the latch mechanism 214B illustrated in FIGS. 9 and 10, the second magnetic member 218B comprises a magnet 224B. Further, the first magnetic member 216B comprises a first magnet 226B and a second magnet 228B, wherein the first magnet 226B is positioned closer to the edge 220B of the lid 206B than the second magnet 228B. The first magnet 226B and the second magnet 228B of the first magnetic member 216B define opposing polarities. Further, the magnet 224B of the second magnetic member 218B and the first magnet 226B of the first magnetic member 216B define opposing polarities.

Accordingly, in the closed configuration illustrated in FIG. 9, the first magnet 226B of the first magnetic member 216B and the magnet 224B of the second magnetic member 218B are attracted to one another due to their opposing polarities. Thus, the latch mechanism 214B holds the base 204B and the lid 206B in the closed configuration. Thereby, accidental opening of the portable computing device 200B may be averted.

The latch mechanism 214B may be configured to release to allow pivoting of the lid 206B with respect to the base 204B. In this regard, in one embodiment the magnetic members may be relatively weak so as to facilitate release thereof. However, use of relatively weak magnetic members may also lead to inadvertent opening of the housing. Accordingly, relatively strong magnetic members may be employed. However, use of relatively strong magnetic members may make moving the lid from the closed configuration to the open configuration difficult. Accordingly, embodiments of the present disclosure may include features configured to facilitate moving the lid relative to the base from the closed configuration to the open configuration.

In this regard, as illustrated in FIG. 10, the second magnetic member 218B may be configured to translate away from the edge 220B of the lid 206B. More particularly, in the embodiment illustrated in FIGS. 9 and 10, the base 204B comprises a moveable portion 230B configured to move with respect to a remainder 232B of the base. For example, the moveable portion 230B may define a protrusion 234B received in a slot 238B. The second magnetic member 218B may be engaged with the moveable portion 230B of the base 204B.

Accordingly, when a user pushes in on the moveable portion 230B of the base 204B (e.g., with a finger 236B), the moveable portion may move toward the remainder 232B of the base 204B. As the moveable portion 230B moves toward the remainder 232B of the base 204B, the user may lift the lid 206B (e.g., using his or her finger 236B). Further, translation of the moveable portion 230B may cause the magnet 224B of the second magnetic member 218B to move away from the first magnet 226B of the first magnetic member 216B, which may reduce the magnetic attraction therebetween. Additionally, the translational movement of the moveable portion 230B may cause the magnet 224B of the second magnetic member 218B to come into proximity with the second magnet 228B of the first magnetic member 216B. Due to the magnet 224B of the second magnetic member 218B and the second magnet 228B of the first magnetic member 216B defining the same or similar polarities, the latch mechanism 214B may transition from holding the lid 206B to the base 204B to forcing the lid away from the base. Accordingly, the latch mechanism 214B may facilitate release of the lid 206B from the base 204B when a user presses on the moveable portion 230B of the base 204B.

Further, as illustrated in FIG. 9, the edge 222B of the base 204B may substantially align with the edge 220B of the lid 206B prior to movement of the second magnetic member 218B. In this regard, alignment of the edges 220B, 222B of the housing 202B may provide a pleasing appearance. However, the edge 222B of the base 204B may be configured to retract from the edge 220B of the lid 206B during movement of the second magnetic member 218B such that the edge of the lid is exposed, as illustrated in FIG. 10. By exposing the edge 220B of the lid 206B, a user may more easily open the lid. Further, by allowing for movement of the moveable portion 230B in the manner described above, the edge 220B of the lid may be exposed without requiring use of an inset portion (see, e.g., inset portion 114 in FIG. 1). In this regard, use of an inset portion may adversely affect the appearance of the portable computing device and/or require additional machining.

Figure 11:
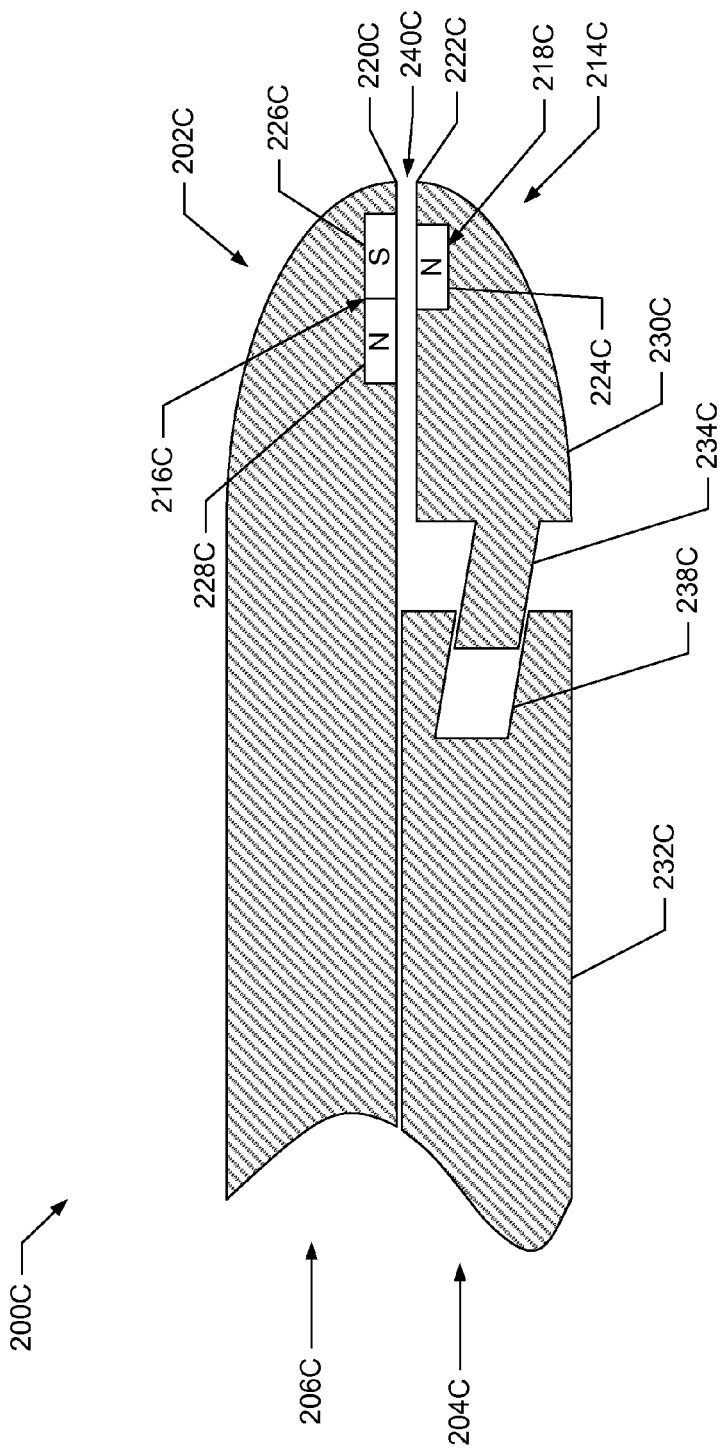
FIG. 11 illustrates a sectional view through the portable computing device of FIG. 6 along line A-A in an embodiment in which a moveable portion of the latch mechanism is configured to translate toward a lid, the latch mechanism illustrated in an engaged configuration according to an example embodiment of the present disclosure.
Figure 12:
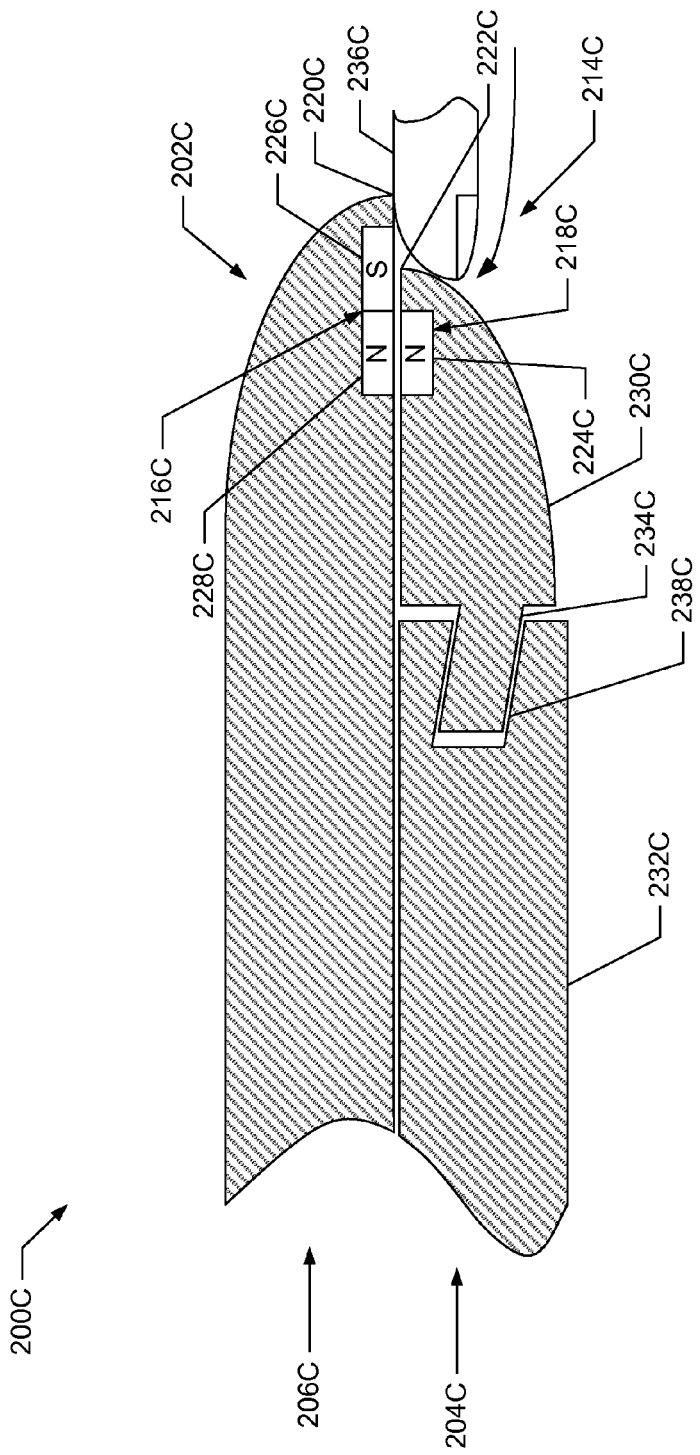
FIG. 12 illustrates the portable computing device of FIG. 11 in a released configuration in which portions of the latch mechanism repulse one another.

FIGS. 11 and 12 illustrate a third embodiment of the portable computing device 200C. In the latch mechanism 214C illustrated in FIGS. 11 and 12, the second magnetic member 218C comprises a magnet 224C. Further, the first magnetic member 216C comprises a first magnet 226C and a second magnet 228C, wherein the first magnet 226C is positioned closer to the edge 220C of the lid 206C than the second magnet 228C. The first magnet 226C and the second magnet 228C of the first magnetic member 216C define opposing polarities. Further, the magnet 224C of the second magnetic member 218C and the first magnet 226C of the first magnetic member 216C define opposing polarities.

Accordingly, in the closed configuration illustrated in FIG. 11, the first magnet 226C of the first magnetic member 216C and the magnet 224C of the second magnetic member 218C are attracted to one another due to their opposing polarities. Thus, the latch mechanism 214C holds the base 204C and the lid 206C in the closed configuration. Thereby, accidental opening of the portable computing device 200C may be averted.

The latch mechanism 214C may be configured to release to allow pivoting of the lid 206C with respect to the base 204C. In this regard, in one embodiment the magnetic members may be relatively weak so as to facilitate release thereof. However, use of relatively weak magnetic members may also lead to inadvertent opening of the housing. Accordingly, relatively strong magnetic members may be employed. However, use of relatively strong magnetic members may make moving the lid from the closed configuration to the open configuration difficult. Accordingly, embodiments of the present disclosure may include features configured to facilitate moving the lid relative to the base from the closed configuration to the open configuration.

In this regard, as illustrated in FIG. 12, the second magnetic member 218C may be configured to translate away from the edge 220C of the lid 206C. More particularly, in the embodiment illustrated in FIGS. 11 and 12, the base 204C comprises a moveable portion 230C configured to move with respect to a remainder 232C of the base. For example, the moveable portion 230C may define a protrusion 234C received in a slot 238C. The second magnetic member 218C may be engaged with the moveable portion 230C of the base 204C.

Accordingly, when a user pushes in on the moveable portion 230C of the base 204C (e.g., with a finger 236C), the moveable portion may move toward the remainder 232C of the base 204C. Further, the moveable portion 230C and the second magnetic member 218C may move toward the lid 206C while translating away from the edge 220C of the lid. In this regard, as illustrated, the slot 238C may angle toward the lid 104C in the closed configuration. As the moveable portion 230C moves toward the remainder 232C of the base 204C, the user may lift the lid 206C (e.g., using his or her finger 236C). The angle of the slot 238C may assist in the opening movement by causing the user's finger 236C to originally angle upwardly while moving the moveable portion 230C. Thus, the user's finger may smoothly transition to the pivoting movement associated with moving the lid 206C relative to the base. Note that a gap 240C (see, FIG. 11) between the moveable portion 230C of the base 204C and the lid 206C in the closed configuration may facilitate the angled translational movement of the moveable portion.

Translation of the moveable portion 230C may cause the magnet 224C of the second magnetic member 218C to move away from the first magnet 226C of the first magnetic member 216C, which may reduce the magnetic attraction therebetween. Further, the translational movement of the moveable portion 230C may cause the magnet 224C of the second magnetic member 218C to come into proximity with the second magnet 228C of the first magnetic member 216C. Due to the magnet 224C of the second magnetic member 218C and the second magnet 228C of the first magnetic member 216C defining the same or similar polarities, the latch mechanism 214C may switch from holding the lid 206C to the base 204C to forcing the lid away from the base. Accordingly, the latch mechanism 214C may facilitate release of the lid 206C from the base 204C when a user presses on the moveable portion 230C of the base 204C.

Further, as illustrated in FIG. 11, the edge 222C of the base 204C may substantially align with the edge 220C of the lid 206C (in terms of extension away from the hinge) prior to movement of the second magnetic member 218C. In this regard, alignment of the edges 220C, 222C of the housing 202C may provide a pleasing appearance. However, the edge 222C of the base 204C may be configured to retract from the edge 220C of the lid 206C during movement of the second magnetic member 218C such that the edge of the lid is exposed, as illustrated in FIG. 12. By exposing the edge 220C of the lid 206C, a user may more easily open the lid. Further, by allowing for movement of the moveable portion 230C in the manner described above, the edge 220C of the lid may be exposed without requiring use of an inset portion (see, e.g., inset portion 114 in FIG. 1). In this regard, use of an inset portion may adversely affect the appearance of the portable computing device and/or require additional machining.

Figure 13:
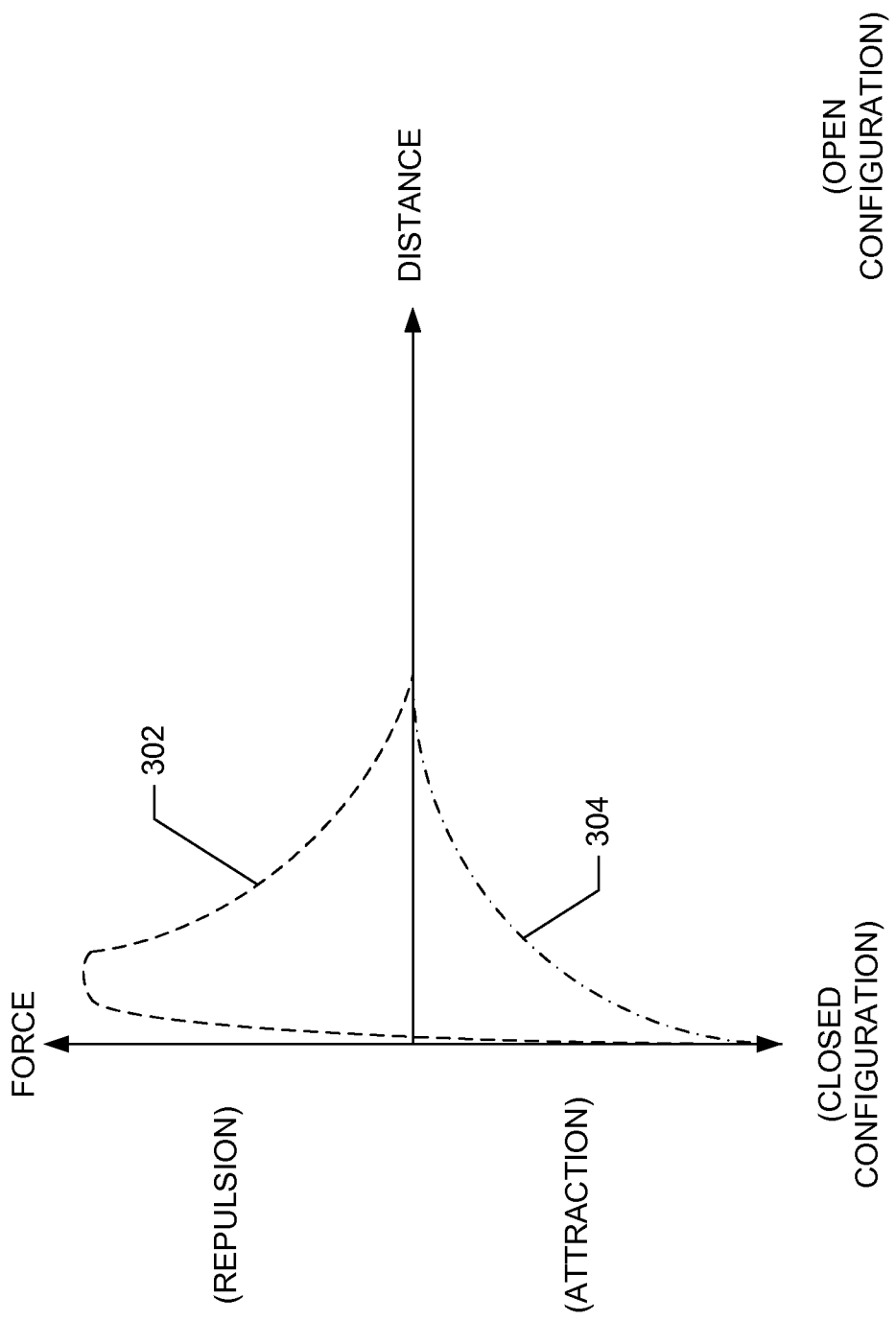
FIG. 13 illustrates a force curve associated with opening and closing the portable computing devices of FIGS. 7-12 according to an example embodiment of the present disclosure.

FIG. 13 illustrates a graph of force (vertical axis) versus distance (horizontal axis) associated with the latch mechanisms 214A-C described above and illustrated in FIGS. 7-12. Note that minor variations in the forces caused by the latch mechanism 214A-C due to variations in the designs thereof may exist. Accordingly, the graph illustrated in FIG. 13 should be understood to represent only a generic illustration of the forces involved in employing the latch mechanisms 214A-C.

Line 302 in FIG. 13 schematically illustrates forces between the lid 206A-C and the base 204A-C caused by the above-described latch mechanisms 214A-C during movement of the portable computing device 200A-C between the closed configuration and the open configuration. As illustrated by line 302, prior to moving the moveable portion of the base, the lid and the base may attract one another. Thereafter, as further illustrated by line 302, as the moveable portion of the base moves, interaction between the magnetic members of the latch mechanism may switch from attraction to repulsion, which facilitates opening the lid. Line 304 schematically illustrates forces between the lid and the base caused by a latch mechanism during movement of the portable computing device from the open configuration to the closed configuration. As illustrated, as the lid and base are moved from the open configuration toward the closed configuration, the magnetic members may attract one another (due to the moveable portion of the base being in the initial undisplaced position), such that the lid and base are held shut in the closed configuration.

Figure 14:
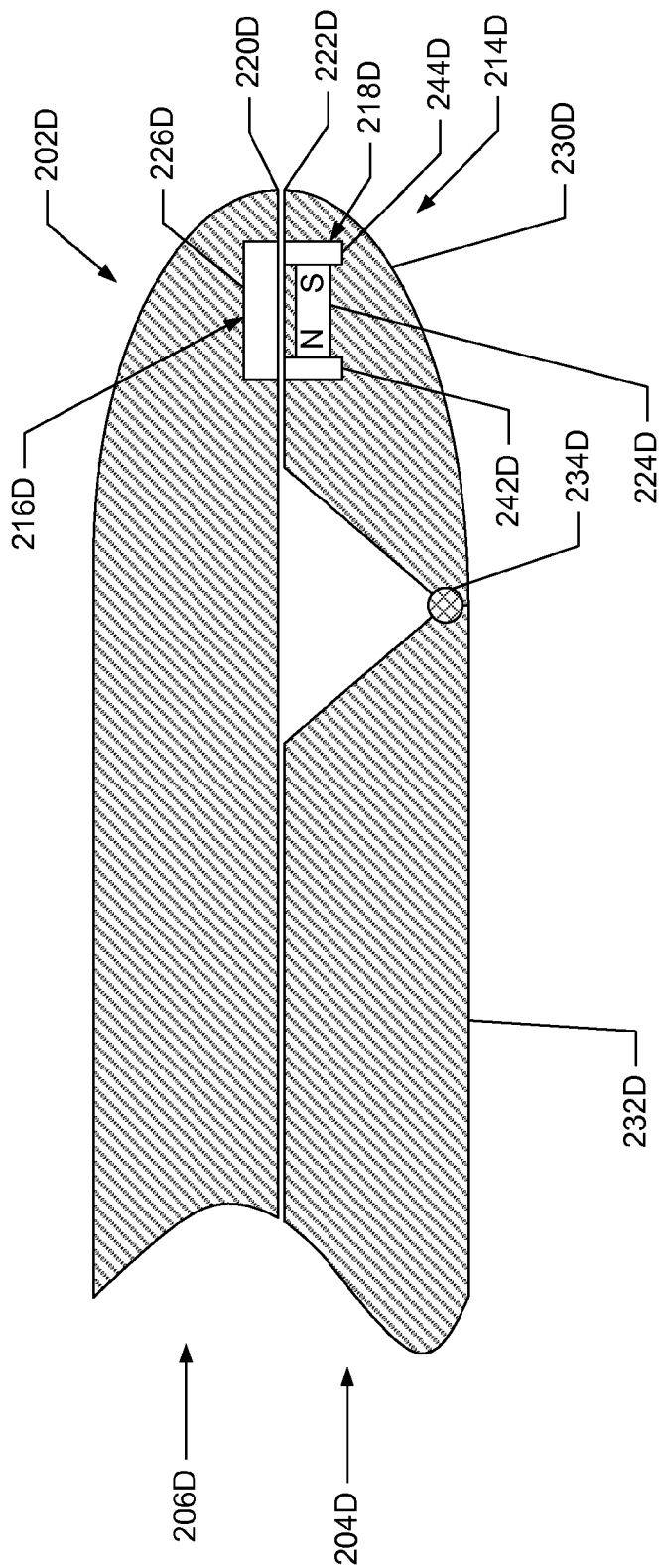
FIG. 14 illustrates a sectional view through the portable computing device of FIG. 6 along line A-A in an embodiment in which a moveable portion of the latch mechanism is configured to pivot, the latch mechanism illustrated in an engaged configuration according to an example embodiment of the present disclosure.
Figure 15:
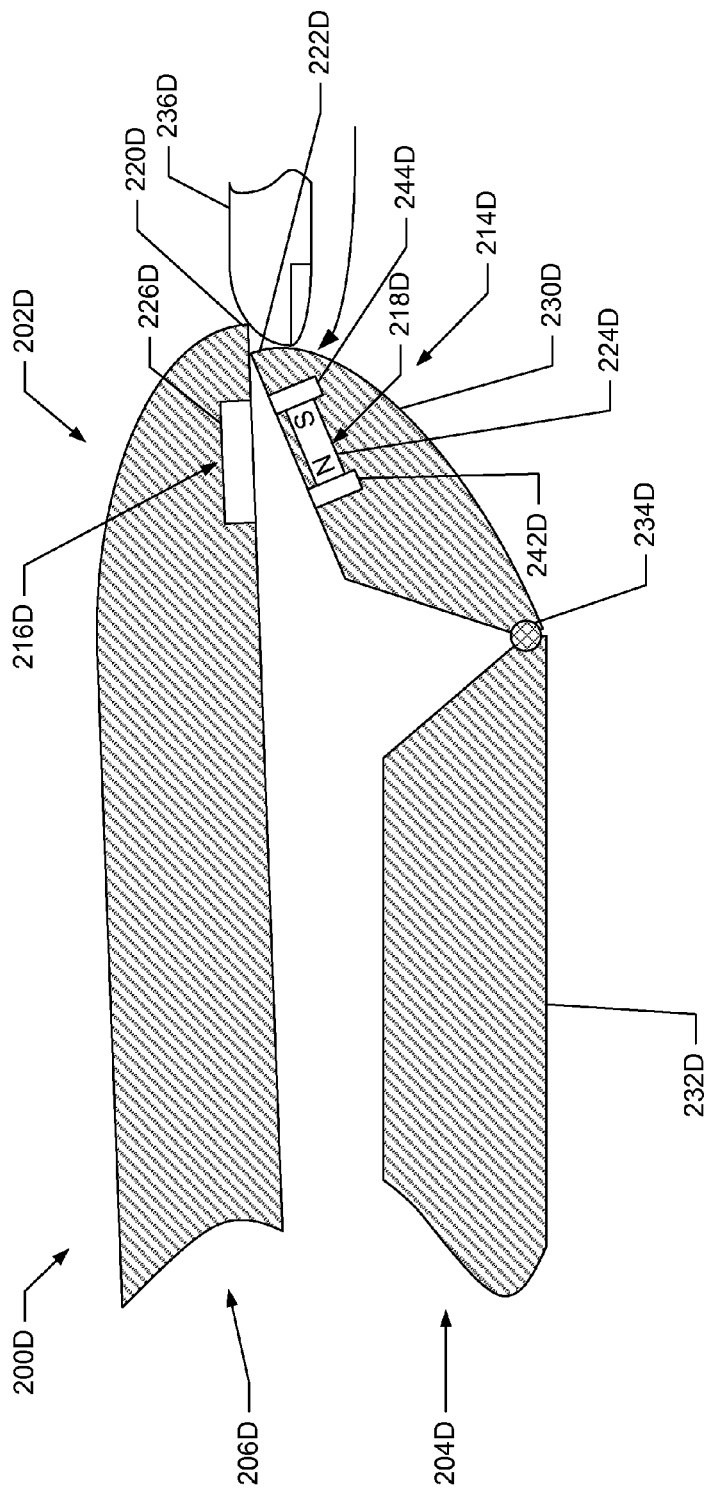
FIG. 15 illustrates the portable computing device of FIG. 14 in a released configuration in which magnetic attraction between portions of the latch mechanism is relieved.

Note that in the embodiments of the portable computing devices described above, the latch mechanisms employed magnets defining opposing polarities in the lid which moved from an attractive configuration to a repulsive configuration based on movement of a magnet in the base. In an alternate embodiment, the lid may include a single magnet and the base may include magnets defining opposing polarities, with substantially the same functionality. As a result of the above-described configuration of magnets, the lid may pop away from the base during release of the lid from the base due to the repulsive forces between the magnets. Additionally, various other numbers of magnets may be employed to provide similar functionality Further, in other embodiments, alternate configurations of magnetic members may be employed. In this regard, FIGS. 14-19 illustrate cross-sectional views through additional embodiments of the portable computing device 200 along line A-A from FIG. 6. FIGS. 14 and 15 illustrate a fourth embodiment of the portable computing device 200D. In the latch mechanism 214D illustrated in FIGS. 14 and 15, the first magnetic member 216D comprises an attractor plate 226D. The attractor plate 226D may comprise a ferromagnetic material, such as steel. In this regard, the magnetic members described herein may not each comprise a permanent magnet in all embodiments.

Further, the second magnetic member 218D may comprise a magnet 224D (e.g., a permanent magnet). In the illustrated embodiment the second magnetic member 218D further comprises first and second shunts 242D, 244D. The shunts 242D, 244D may comprise a piece of low carbon steel or other ferromagnetic material. The shunts 242D, 244D may be configured to divert and directionalize a magnetic field produced by the magnet 224D in a desired direction. In this regard, the shunts 242D, 244D may be configured to direct the magnetic field produced by the magnet 224D toward the attractor plate 226D when the lid 206D is in the closed configuration. Accordingly, the magnetic field produced by the second magnetic member 218D may attract the attractor plate 226D of the first magnetic member 216D while limiting the amount of magnetic field extending in other directions. Thereby, for example, issues with respect to flux leakage outside of the housing 202D or into a mass storage device in the portable computing device 200D may be avoided. Additionally, the particular illustrated configuration of the second magnetic member 218D with the shunts 242D, 244D on opposing sides of the second magnetic member 218D may produce a relatively strong magnetic field at short distances which drops off quickly at longer distances.

Accordingly, in the closed configuration illustrated in FIG. 14, the attractor plate 226D of the first magnetic member 216D and the magnet 224D of the second magnetic member 218D are attracted to one another due to the magnet being attracted to the ferromagnetic material of the attractor plate. Thus, the latch mechanism 214D holds the base 204D and the lid 206D in the closed configuration. Thereby, accidental opening of the portable computing device 200D may be averted.

The latch mechanism 214D may be configured to release to allow pivoting of the lid 206D with respect to the base 204D. In this regard, in one embodiment the magnet may be relatively weak so as to facilitate release thereof. However, use of relatively weak magnets may also lead to inadvertent opening of the housing. Accordingly, relatively strong magnets may be employed. However, use of relatively strong magnets may make moving the lid from the closed configuration to the open configuration difficult. Accordingly, embodiments of the present disclosure may include features configured to facilitate moving the lid relative to the base from the closed configuration to the open configuration.

In this regard, as illustrated in FIG. 15, the second magnetic member 218D may be configured to pivot with respect to the lid 206D. More particularly, in the embodiment illustrated in FIGS. 14 and 15, the base 204D comprises a moveable portion 230D configured to move with respect to a remainder 232D of the base. For example, the moveable portion 230D and the remainder 232D of the base 204D may be connected by a hinge 234D. The second magnetic member 218D may be engaged with the moveable portion 230D of the base 204D.

Accordingly, when a user pushes up on the moveable portion 230D of the base 204D (e.g., with a finger 236D), the moveable portion may pivot with respect to the remainder 232D of the base 204D. As the moveable portion 230D pivots, the moveable portion and/or the user's finger 236D may lift the lid 206D. Further, pivoting of the moveable portion 230D may cause the magnet 224D of the second magnetic member 218D to retract from the attractor plate 226D of the first magnetic member 216D, which may reduce the magnetic attraction therebetween. Accordingly, the latch mechanism 214D may release of the lid 206D from the base 204D when a user presses on the moveable portion 230D of the base 204D.

Further, as illustrated in FIG. 15, the edge 222D of the base 204D may substantially align with the edge 220D of the lid 206D prior to movement of the second magnetic member 218D. In this regard, alignment of the edges 220D, 222D of the housing 202D may provide a pleasing appearance. However, the edge 222D of the base 204D may be configured to retract from the edge 220D of the lid 206D during movement of the second magnetic member 218D such that the edge of the lid is exposed, as illustrated in FIG. 15. By exposing the edge 220D of the lid 206D, a user may more easily open the lid. Further, by allowing for movement of the moveable portion 230D in the manner described above, the edge 220D of the lid may be exposed without requiring use of an inset portion (see, e.g., inset portion 114 in FIG. 1). In this regard, use of an inset portion may adversely affect the appearance of the portable computing device and/or require additional machining.

Figure 16:
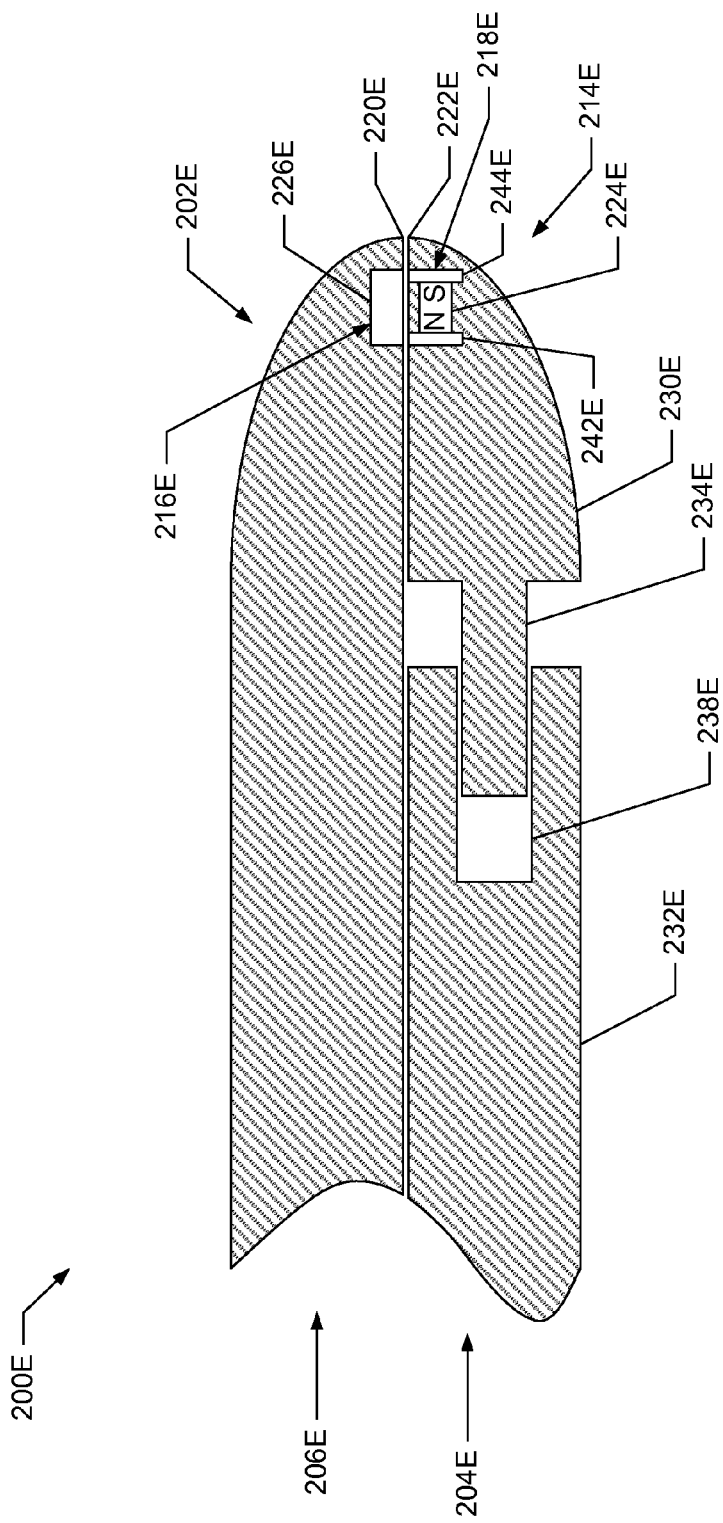
FIG. 16 illustrates a sectional view through the portable computing device of FIG. 6 along line A-A in an embodiment in which a moveable portion of the latch mechanism is configured to translate, the latch mechanism illustrated in an engaged configuration according to an example embodiment of the present disclosure.
Figure 17:
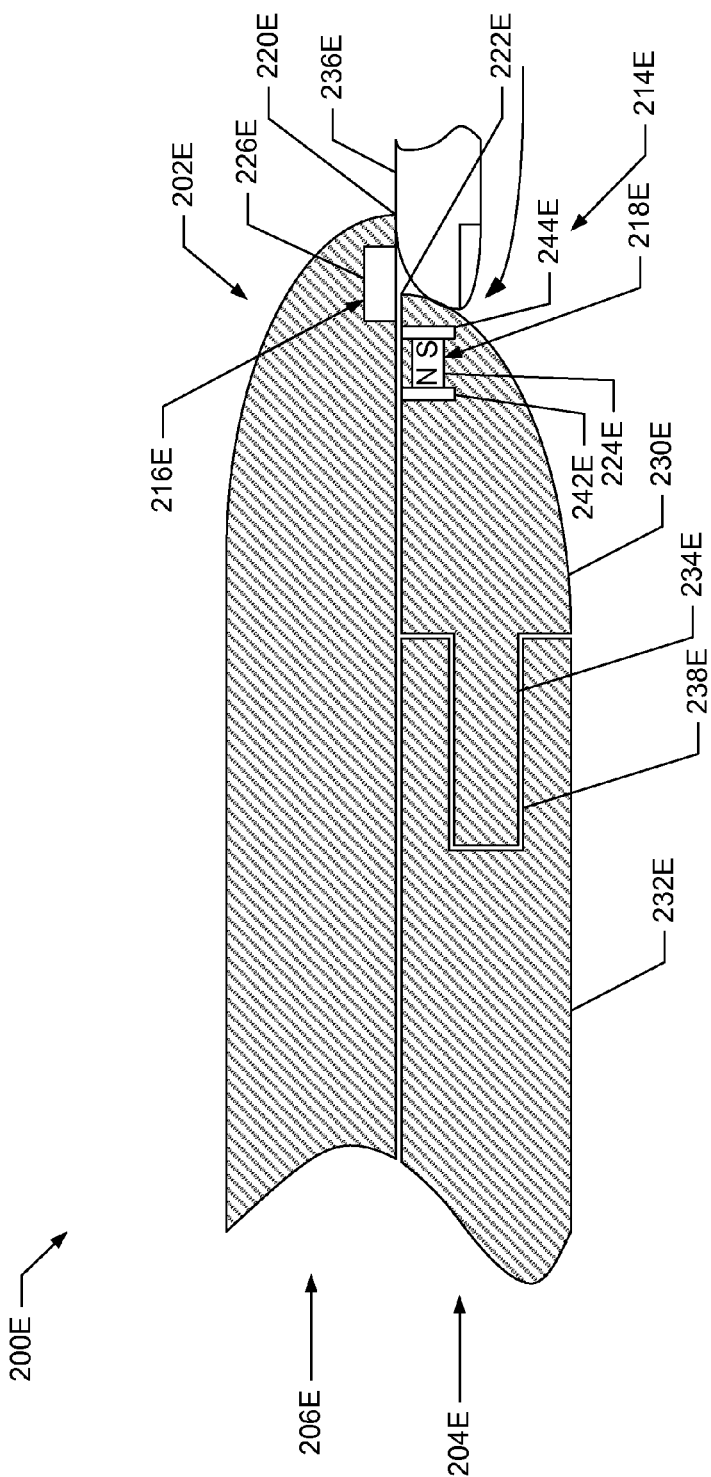
FIG. 17 illustrates the portable computing device of 16 in a released configuration in which magnetic attraction between portions of the latch mechanism is relieved.

FIGS. 16 and 17 illustrate a fifth embodiment of the portable computing device 200E. In the latch mechanism 214E illustrated in FIGS. 16 and 17, the first magnetic member 216E comprises an attractor plate 226E. Further, the second magnetic member 218E may comprise a magnet 224E. In the illustrated embodiment the second magnetic member 218E further comprises first and second shunts 242E, 244E. Thus, the first and second magnetic members 216E, 218E may be substantially similar to the first and second magnetic members 216D, 218D of the portable computing device 200D illustrated in FIGS. 14 and 15.

Accordingly, in the closed configuration illustrated in FIG. 16, the attractor plate 226E of the first magnetic member 216E and the magnet 224E of the second magnetic member 218E are attracted to one another. Thus, the latch mechanism 214E holds the base 204E and the lid 206E in the closed configuration. Thereby, accidental opening of the portable computing device 200E may be averted.

The latch mechanism 214E may be configured to release to allow pivoting of the lid 206E with respect to the base 204E. In this regard, in one embodiment the magnetic members may be relatively weak so as to facilitate release thereof. However, use of relatively weak magnetic members may also lead to inadvertent opening of the housing. Accordingly, relatively strong magnetic members may be employed. However, use of relatively strong magnetic members may make moving the lid from the closed configuration to the open configuration difficult. Accordingly, embodiments of the present disclosure may include features configured to facilitate moving the lid relative to the base from the closed configuration to the open configuration.

In this regard, as illustrated in FIG. 17, the second magnetic member 218E may be configured to translate away from the edge 220E of the lid 206E. More particularly, in the embodiment illustrated in FIGS. 16 and 17, the base 204E comprises a moveable portion 230E configured to move with respect to a remainder 232E of the base. For example, the moveable portion 230E may define a protrusion 234E received in a slot 238E. The second magnetic member 218E may be engaged with the moveable portion 230E of the base 204E.

Accordingly, when a user pushes in on the moveable portion 230E of the base 204E (e.g., with a finger 236E), the moveable portion may move toward the remainder 232E of the base 204E. As the moveable portion 230E moves toward the remainder 232E of the base 204E, the user may lift the lid 206E (e.g., using his or her finger 236E). Further, translation of the moveable portion 230E may cause the magnet 224E of the second magnetic member 218E to move away from the attractor plate 226E of the first magnetic member 216E, which may reduce the magnetic attraction therebetween.

Accordingly, the latch mechanism 214E may facilitate release of the lid 206E from the base 204E when a user presses on the moveable portion 230E of the base 204E by reducing the magnetic attraction between the base and the lid.

Further, as illustrated in FIG. 17, the edge 222E of the base 204E may substantially align with the edge 220E of the lid 206E prior to movement of the second magnetic member 218E. In this regard, alignment of the edges 220E, 222E of the housing 202E may provide a pleasing appearance. However, the edge 222E of the base 204E may be configured to retract from the edge 220E of the lid 206E during movement of the second magnetic member 218E such that the edge of the lid is exposed, as illustrated in FIG. 17. By exposing the edge 220E of the lid 206E, a user may more easily open the lid. Further, by allowing for movement of the moveable portion 230E in the manner described above, the edge 220E of the lid may be exposed without requiring use of an inset portion (see, e.g., inset portion 114 in FIG. 1). In this regard, use of an inset portion may adversely affect the appearance of the portable computing device and/or require additional machining.

Figure 18:
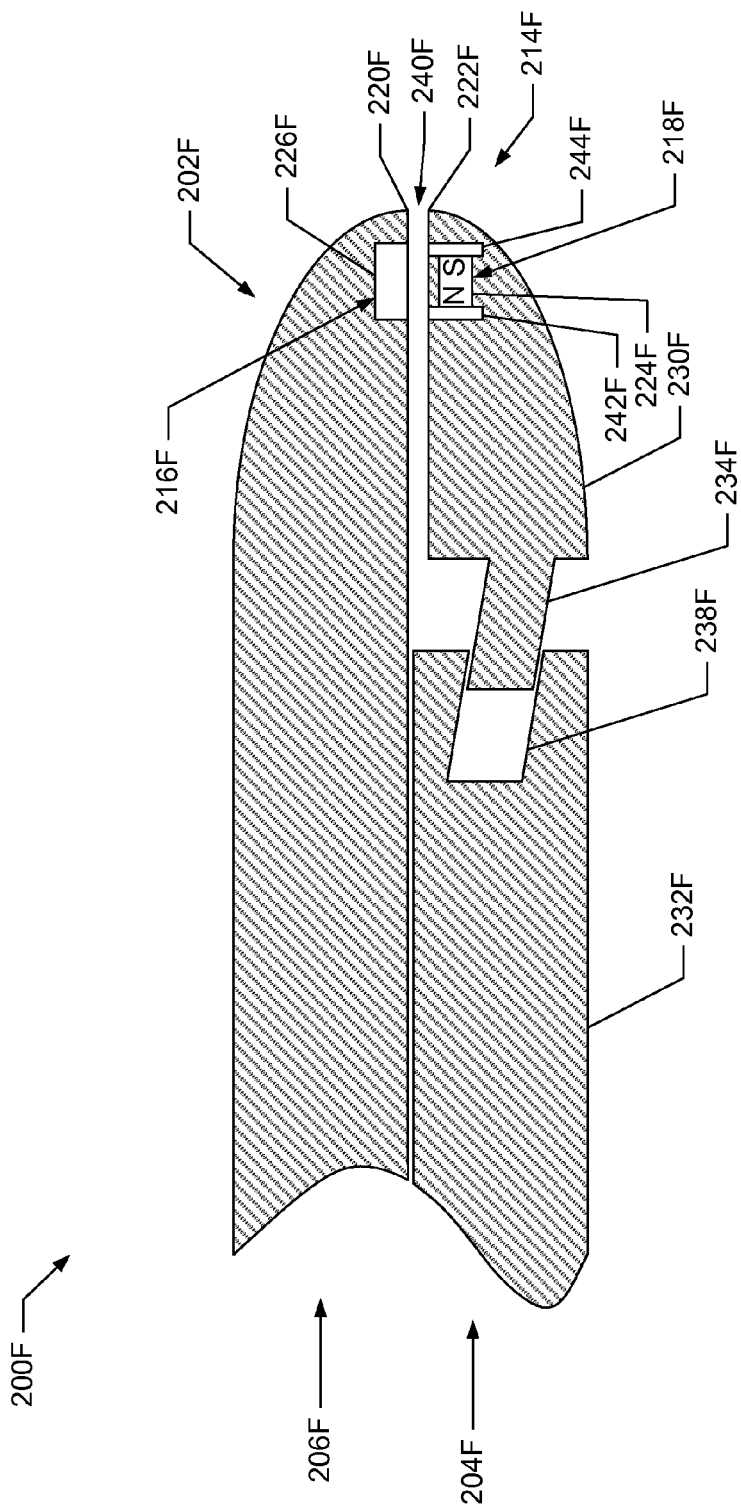
FIG. 18 illustrates a sectional view through the portable computing device of FIG. 6 along line A-A in an embodiment in which a moveable portion of the latch mechanism is configured to translate toward a lid, the latch mechanism illustrated in an engaged configuration according to an example embodiment of the present disclosure.
Figure 19:
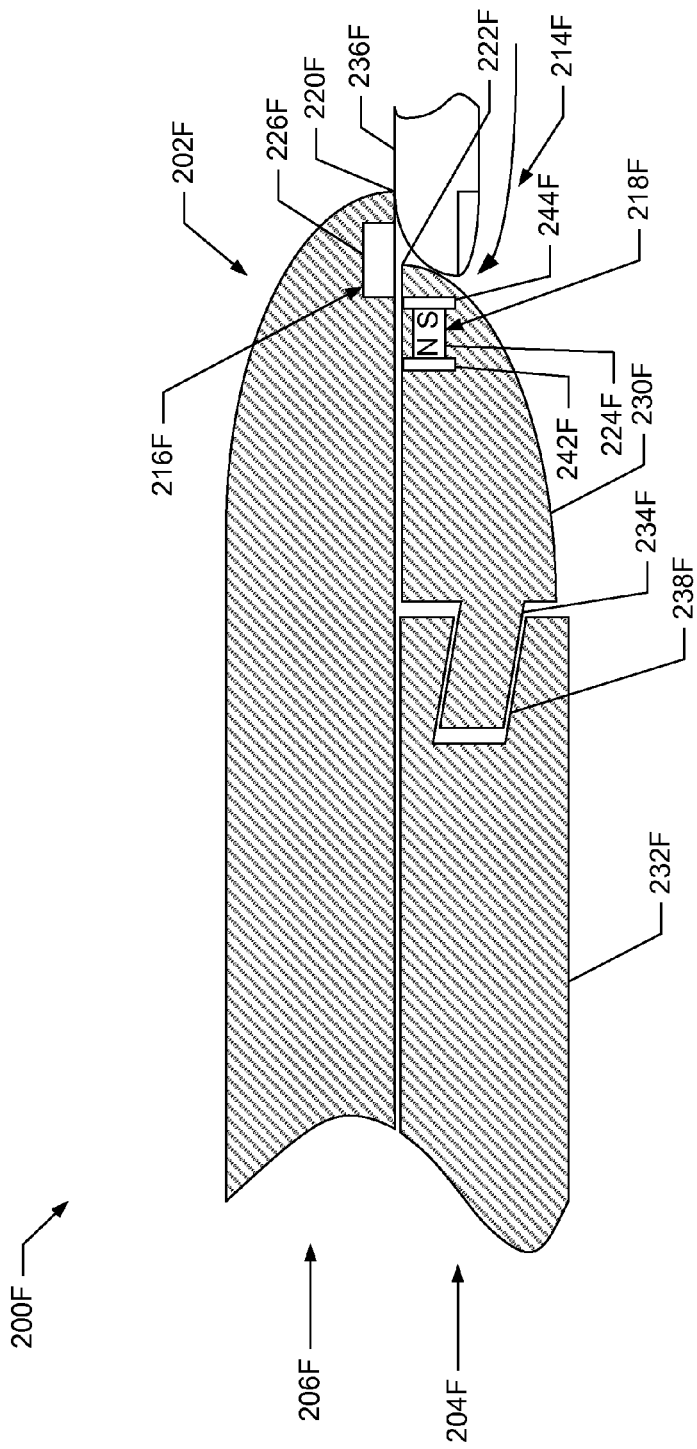
FIG. 19 illustrates the portable computing device of 18 in a released configuration in which magnetic attraction between portions of the latch mechanism is relieved.

FIGS. 18 and 19 illustrate a third embodiment of the portable computing device 200F. In the latch mechanism 214F illustrated in FIGS. 11 and 12, the first magnetic member 216F comprises an attractor plate 226F. Further, the second magnetic member 218F may comprise a magnet 224F. In the illustrated embodiment the second magnetic member 218E further comprises first and second shunts 242F, 244F. Thus, the first and second magnetic members 216E, 218E may be substantially similar to the first and second magnetic members 216D, 218D of the portable computing device 200D illustrated in FIGS. 14 and 15.

Accordingly, in the closed configuration illustrated in FIG. 18, the attractor plate 226F of the first magnetic member 216F and the magnet 224F of the second magnetic member 218F are attracted to one another. Thus, the latch mechanism 214F holds the base 204F and the lid 206F in the closed configuration. Thereby, accidental opening of the portable computing device 200F may be averted.

The latch mechanism 214F may be configured to release to allow pivoting of the lid 206F with respect to the base 204F. In this regard, in one embodiment the magnetic members may be relatively weak so as to facilitate release thereof. However, use of relatively weak magnetic members may also lead to inadvertent opening of the housing. Accordingly, relatively strong magnetic members may be employed. However, use of relatively strong magnetic members may make moving the lid from the closed configuration to the open configuration difficult. Accordingly, embodiments of the present disclosure may include features configured to facilitate moving the lid relative to the base from the closed configuration to the open configuration.

In this regard, as illustrated in FIG. 19, the second magnetic member 218F may be configured to translate away from the edge 220F of the lid 206F. More particularly, in the embodiment illustrated in FIGS. 18 and 19, the base 204F comprises a moveable portion 230F configured to move with respect to a remainder 232F of the base. For example, the moveable portion 230F may define a protrusion 234F received in a slot 238F. The second magnetic member 218F may be engaged with the moveable portion 230F of the base 204F.

Accordingly, when a user pushes in on the moveable portion 230F of the base 204F (e.g., with a finger 236F), the moveable portion may move toward the remainder 232F of the base 204F. Further, the moveable portion 230F and the second magnetic member 218F may move toward the lid 206F while translating away from the edge 220F of the lid. In this regard, as illustrated, the slot 238F may angle toward the lid 104F in the closed configuration. As the moveable portion 230F moves toward the remainder 232F of the base 204F, the user may lift the lid 206F (e.g., using his or her finger 236F). The angle of the slot 238F may assist in the opening movement by causing the user's finger 236F to originally angle upwardly while moving the moveable portion 230F. Thus, the user's finger may smoothly transition to the pivoting movement associated with moving the lid 206F relative to the base. Note that a gap 240F between the moveable portion 230F of the base 204F and the lid 206F in the closed configuration may facilitate the angled translational movement of the moveable portion.

Translation of the moveable portion 230F may cause the magnet 224F of the second magnetic member 218F to move away from the attractor plate 226F of the first magnetic member 216F, which may reduce the magnetic attraction therebetween. Accordingly, the latch mechanism 214F may facilitate release of the lid 206F from the base 204F when a user presses on the moveable portion 230F of the base 204F.

Further, as illustrated in FIG. 18, the edge 222F of the base 204F may substantially align with the edge 220F of the lid 206F (in terms of extension away from the hinge) prior to movement of the second magnetic member 218F. In this regard, alignment of the edges 220F, 222F of the housing 202F may provide a pleasing appearance. However, the edge 222F of the base 204F may be configured to retract from the edge 220F of the lid 206F during movement of the second magnetic member 218F such that the edge of the lid is exposed, as illustrated in FIG. 19. By exposing the edge 220F of the lid 206F, a user may more easily open the lid. Further, by allowing for movement of the moveable portion 230F in the manner described above, the edge 220F of the lid may be exposed without requiring use of an inset portion (see, e.g., inset portion 114 in FIG. 1). In this regard, use of an inset portion may adversely affect the appearance of the portable computing device and/or require additional machining.

Figure 20:
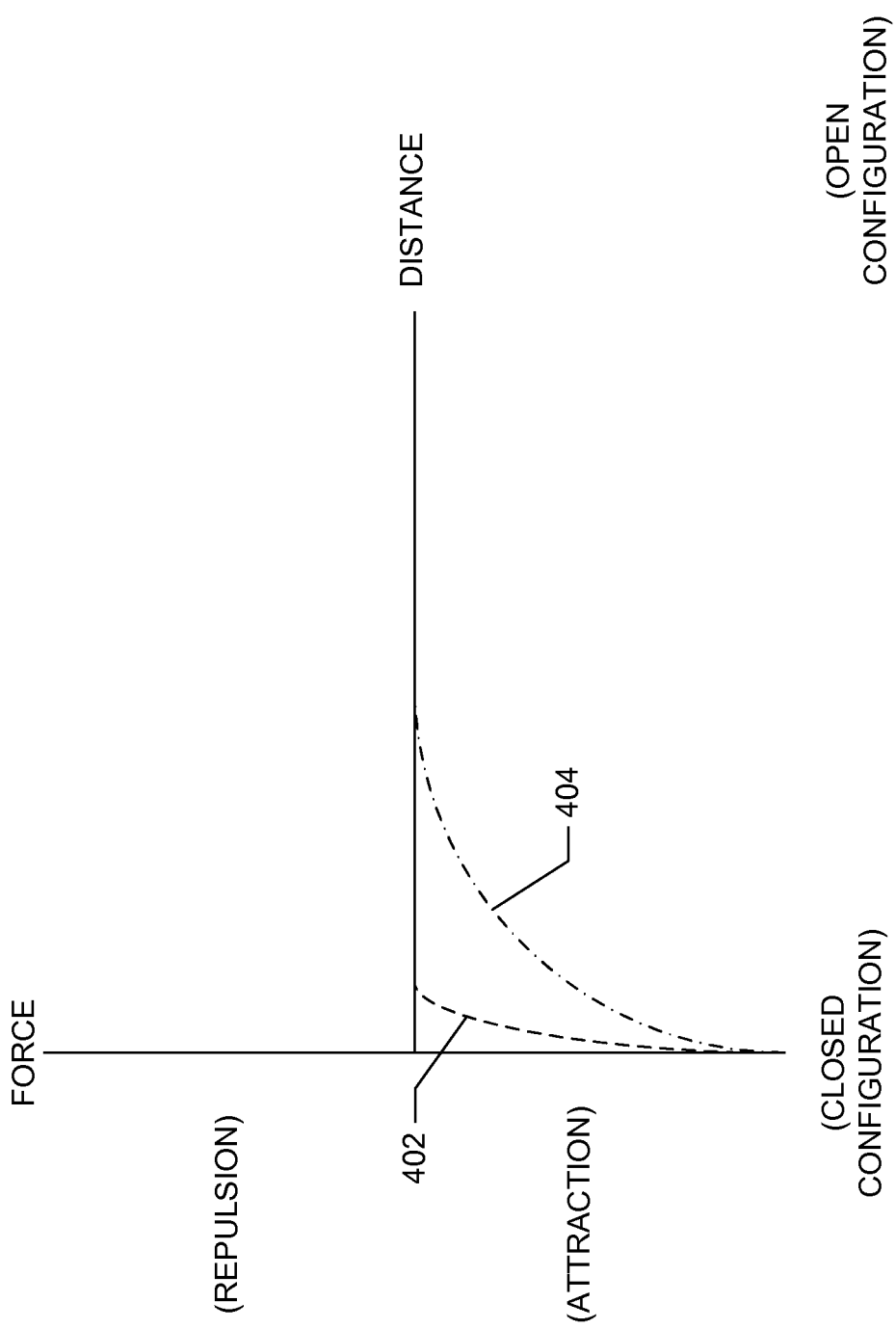
FIG. 20 illustrates a force curve associated with opening and closing the portable computing device of FIGS. 14-19 according to an example embodiment of the present disclosure.

FIG. 20 illustrates a graph of force (vertical axis) versus distance (horizontal axis) associated with the latch mechanisms 214D-F described above and illustrated in FIGS. 14-19. Note that minor variations in the forces caused by the latch mechanism 214D-F due to variations in the designs thereof may exist. Accordingly, the graph illustrated in FIG. 20 should be understood to represent only a generic illustration of the forces involved in employing the latch mechanisms 214D-F.

Line 402 in FIG. 20 schematically illustrates forces between the lid 206D-F and the base 204D-F caused by the above-described latch mechanisms 214D-F during movement of the portable computing device 200D-F between the closed configuration and the open configuration. As illustrated by line 402, prior to moving the moveable portion of the base, the lid and the base may attract one another. However, as a result of relative movement of the magnetic members 216D-F, 218D-F, the magnetic attraction may rapidly drop off during pivoting of the lid 206D-F relative to the base 204D-F. Line 404 schematically illustrates forces between the lid and the base caused by a latch mechanism during movement of the portable computing device from the open configuration to the closed configuration. As illustrated, as the lid and base are moved from the open configuration toward the closed configuration, the magnetic members may attract one another (due to the moveable portion of the base being in the initial undisplaced position), such that the lid and base are held shut in the closed configuration. Note that the magnetic attraction may be relatively stronger during closing of the lid as a result of the moveable portion of the base being returned to the initial position.

Figure 21:
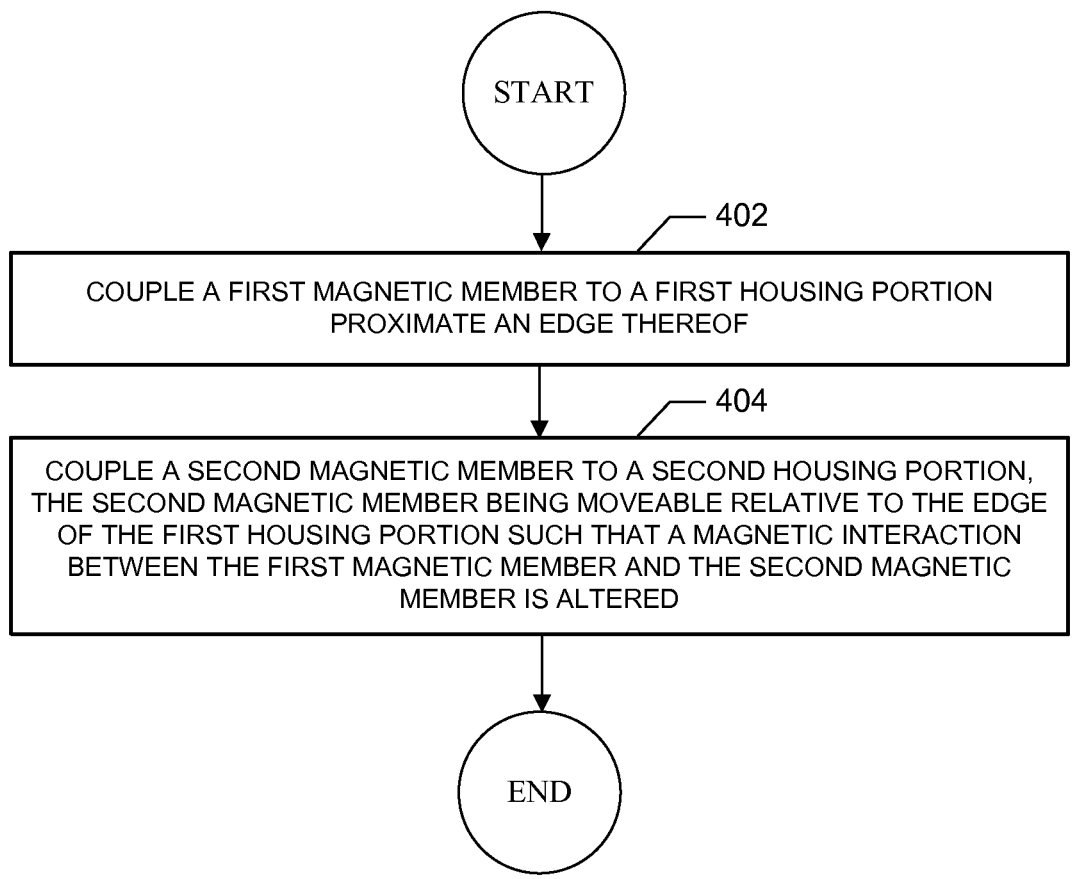
FIG. 21 illustrates a method for assembling a latch mechanism according to an example embodiment of the present disclosure.

A method for assembling a latch mechanism is also provided. As illustrated in FIG. 21, the method may include coupling a first magnetic member to a first housing portion proximate an edge thereof at operation 402. Further, the method may include coupling a second magnetic member to a second housing portion, the second magnetic member being moveable relative to the edge of the first housing portion such that a magnetic interaction between the first magnetic member and the second magnetic member is altered at operation 404.

In some embodiments of the method, coupling the second magnetic member to the second housing portion at operation 404 may comprise coupling the second magnetic member to the second housing portion such that the second magnetic member may pivot with respect to the first housing portion. Further, coupling the second magnetic member to the second housing portion at operation 404 may comprise coupling the second magnetic member to a moveable portion of the second housing portion and coupling the moveable portion to a remainder of the second housing portion such that the moveable portion may move with respect to the remainder of the second housing portion. The method may additionally include hingedly coupling the first housing portion to the second housing portion. Hingedly coupling the first housing portion to the second housing portion may comprise substantially aligning an edge of the second housing portion with an edge of the first housing portion in the closed configuration. Further, coupling the first magnetic member to the first housing portion at operation 402 may comprise coupling the first magnetic member to a lid of a portable computing device and coupling the second magnetic member to the second housing portion at operation 404 may comprise coupling the second magnetic member to a base of the portable computing device.

Figure 22:
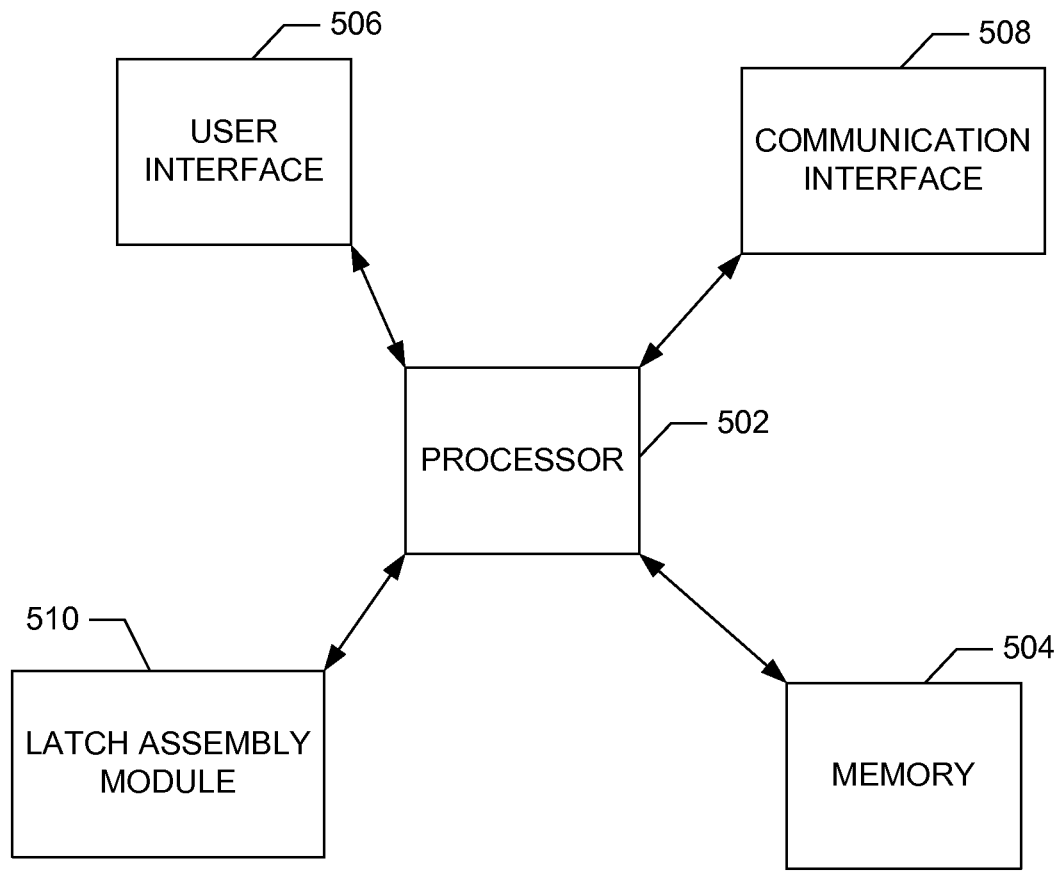
FIG. 22 schematically illustrates a block diagram of an electronic device according to an example embodiment of the present disclosure.

FIG. 22 is a block diagram of an electronic device 700 suitable for use with the described embodiments. In one example embodiment the electronic device 700 may be embodied in or as a controller configured for controlling the latch mechanism assembly operations as disclosed herein. In this regard, the electronic device 700 may be configured to control or execute the above-described latch mechanism assembly operations.

The electronic device 500 illustrates circuitry of a representative computing device. The electronic device 500 may include a processor 502 that may be microprocessor or controller for controlling the overall operation of the electronic device 500. In one embodiment the processor 502 may be particularly configured to perform the functions described herein relating assembling a portable computing device or other device including a latch mechanism. The electronic device 500 may also include a memory device 504. The memory device 504 may include non-transitory and tangible memory that may be, for example, volatile and/or non-volatile memory. The memory device 504 may be configured to store information, data, files, applications, instructions or the like. For example, the memory device 504 could be configured to buffer input data for processing by the processor 502. Additionally or alternatively, the memory device 504 may be configured to store instructions for execution by the processor 502.

The electronic device 500 may also include a user interface 506 that allows a user of the electronic device 500 to interact with the electronic device. For example, the user interface 506 can take a variety of forms, such as a button, keypad, dial, touch screen, audio input interface, visual/image capture input interface, input in the form of sensor data, etc. Still further, the user interface 506 may be configured to output information to the user through a display, speaker, or other output device. A communication interface 508 may provide for transmitting and receiving data through, for example, a wired or wireless network such as a local area network (LAN), a metropolitan area network (MAN), and/or a wide area network (WAN), for example, the Internet.

The electronic device 500 may also include a latch assembly module 510. The processor 502 may be embodied as, include or otherwise control the latch assembly module 510. The latch assembly module 510 may be configured for controlling or executing the operations relating to assembling the latch mechanisms discussed herein.

In this regard, for example, in one embodiment a computer program product comprising at least one computer-readable storage medium having computer-executable program code portions stored therein is provided. The computer-executable program code portions, which may be stored in the memory device 504, may include program code instructions for performing the latch assembly operations disclosed herein.

Although the foregoing disclosure has been described in detail by way of illustration and example for purposes of clarity and understanding, it will be recognized that the above described disclosure may be embodied in numerous other specific variations and embodiments without departing from the spirit or essential characteristics of the disclosure. Certain changes and modifications may be practiced, and it is understood that the disclosure is not to be limited by the foregoing details, but rather is to be defined by the scope of the appended claims.

What is claimed is:

1. A latch mechanism, comprising:
   a first magnetic member carried by a first housing portion proximate an edge thereof; and
   a second magnetic member carried by a second housing portion, the second magnetic member being moveable relative to the edge of the first housing portion such that a magnetic interaction between the first magnetic member and the second magnetic member is altered, wherein the second magnetic member is configured to translate away from the edge of the first housing portion and to move toward the first housing portion while translating away from the edge of the first housing portion.

2. The latch mechanism of claim 1, wherein the second magnetic member is configured to pivot with respect to the first housing portion.

3. The latch mechanism of claim 1, wherein one of the first magnetic member and the second magnetic member comprises a first magnet and a second magnet, the first magnet and the second magnet defining opposing polarities.

4. The latch mechanism of claim 3, wherein the first magnet and the second magnet are positioned at differing distances from an edge of the first housing portion.

5. The latch mechanism of claim 1, wherein one of the first magnetic member and the second magnetic member comprises a permanent magnet and one of the first magnetic member and the second magnetic member is not a permanent magnet.

6. A portable computing device, comprising
   a housing comprising a lid and a base, the lid and the base being coupled to one another at a hinge; and
   a latch mechanism coupled to the housing opposite from the hinge and configured to releasably retain the lid and the base in a closed configuration, the latch mechanism comprising:
      a first magnetic member engaged with the lid proximate an edge thereof; and
      a second magnetic member engaged with the base, the second magnetic member being moveable relative to the edge of the lid such that a magnetic interaction between the first magnetic member and the second magnetic member is altered, wherein the edge of the base is configured to retract from the edge of the lid during movement of the second magnetic member such that the edge of the lid is exposed.

7. The portable computing device of claim 6, wherein the second magnetic member is configured to pivot with respect to the lid.

8. The portable computing device of claim 7, wherein the base comprises a moveable portion configured to move with respect to a remainder of the base, the second magnetic member being engaged with the moveable portion of the base.

9. The portable computing device of claim 6, wherein the second magnetic member is configured to translate away from the edge of the lid.

10. The portable computing device of claim 9, wherein the second magnetic member is configured to move toward the lid while translating away from the edge of the lid.

11. The portable computing device of claim 6, wherein an edge of the base is configured to substantially align with the edge of the lid prior to movement of the second magnetic member.

12. A method for assembling a latch mechanism:
   coupling a first magnetic member to a first housing portion proximate an edge thereof;
   coupling a second magnetic member to a second housing portion, the second magnetic member being moveable relative to the edge of the first housing portion such that a magnetic interaction between the first magnetic member and the second magnetic member is altered, wherein coupling the second magnetic member to the second housing portion comprises coupling the second magnetic member to the second housing portion such that the second magnetic member may pivot with respect to the first housing portion, wherein coupling the second magnetic member to the second housing portion comprises coupling the second magnetic member to a moveable portion of the second housing portion and coupling the moveable portion to a remainder of the second housing portion such that the moveable portion may move with respect to the remainder of the second housing portion.

13. The method of claim 12, further comprising hingedly coupling the first housing portion to the second housing portion.

14. The method of claim 13, wherein hingedly coupling the first housing portion to the second housing portion comprises substantially aligning an edge of the second housing portion with an edge of the first housing portion in a closed configuration.

15. The method of claim 12, wherein coupling the first magnetic member to the first housing portion comprises coupling the first magnetic member to a lid of a portable computing device; and
   wherein coupling the second magnetic member to the second housing portion comprises coupling the second magnetic member to a base of the portable computing device.

16. A portable computing device, comprising
   a housing comprising a lid and a base, the lid and the base being coupled to one another at a hinge; and
   a latch mechanism coupled to the housing opposite from the hinge and configured to releasably retain the lid and the base in a closed configuration, the latch mechanism comprising:
      a first magnetic member carried by the lid proximate an edge thereof; and a second magnetic member carried by the base, the second magnetic member being moveable relative to the edge of the lid such that a magnetic interaction between the first magnetic member and the second magnetic member is altered, wherein the second magnetic member is configured to translate away from the edge of the lid, wherein the second magnetic member is configured to move toward the lid while translating away from the edge of the lid.

17. The portable computing device of claim 16, wherein an edge of the base is configured to substantially align with the edge of the lid prior to movement of the second magnetic member.

* * * * *